United States Patent [19]

Iwashita et al.

[11] Patent Number: 6,141,633
[45] Date of Patent: Oct. 31, 2000

[54] LOGICAL DEVICE VERIFICATION METHOD AND APPARATUS

[75] Inventors: Hiroaki Iwashita; Tsuneo Nakata, both of Kawasaki, Japan

[73] Assignee: Fujitsu Limited, Kawasaki, Japan

[21] Appl. No.: 09/031,209

[22] Filed: Feb. 26, 1998

[30] Foreign Application Priority Data

Feb. 28, 1997 [JP] Japan .................................. 9-045114

[51] Int. Cl.$^7$ .................................................. G06F 17/50
[52] U.S. Cl. .................................. 703/15; 703/2; 703/27; 716/4
[58] Field of Search ........................... 395/500; 364/578; 703/2, 13, 26, 27; 716/4

[56] References Cited

U.S. PATENT DOCUMENTS 5,680,332  10/1997  Raimi et al. ........................ 395/500.05

FOREIGN PATENT DOCUMENTS 10-63537  3/1998  Japan .

OTHER PUBLICATIONS

T. Nakata, et al., "Improving Quality of Simulation–Based Verification Using State Enumeration"; *Fujitsu Scientific & Tech. Journal*, No. 2, pp. 135–142.

J. Burch, et al., "Symbolic Model Checking Sequential Circuit Verification", *IEEE Transation on Computer–Aided Design of Integrated Circuits & Systems*, No. 4, pp. 401–424.

H. Iwashita, et al., "CTL Model Checking Based on Forward State Traversal", *IEEE*, pp. 82–87.

Hyunwoo Cho, et al, "Alogrithms for Approximate FSM Traversal Based on State Space Decomposition", *Design of Integrated Circuits and Systems*, vol. 15, No. 12, pp. 1465–1478.

H. Iwashita, et al., "Forward Model Checking Techniques Oriented to Buggy Designs", *IEEE*, pp. 400–404.

H. Iwashita, et al.; "Automatic Test Program Generation For Pipelined Processors"; In Proceedings of the International Conference on Computer–Aided Design 1994; pp. 580–583.

K. Ravi, et al.; "High–Density Teachability Analysis"; In Proceedings of the International Conference on Computer–Aided Design 1995; pp. 154–158.

J.R. Burch, et al.; "Sequential Circuit Verification Using Symbolic Model Checking"; Proc. $27^{th}$ DAC 1990; pp. 45–51.

H. Iwashita, et al.; "CLT Model Checking Based On Forward State Traversal"; IEEE/ACM International Conference on Computer–Aided Design 1996; pp. 882–87.

E.M. Clarke, et al.; "Efficient Generation of Countexamples And Witnesses In Symbolic Model Checking"; $32^{nd}$ ACM/IEEE Design Automation Conference 1995; pp. 1–6.

Randal E. Bryant, "Graph–Based Algorithms for Boolean Function Manipulation", Transactions On Computers, vol. C–35, No. 8, Aug. 1996, pp. 677–691.

E. M. Clarke et al., "Automatic Verification of Finite–State Concurrent Systems Using Temporal Logic Specifications", ACM Transactions on Programming Languages and Systems, vol. 8, No. 2, Apr. 1986 pp. 244–263.

Fujita et al., "Example of application to actual design of formal verification method", 1994, pp. 719–725.

(List continued on next page.)

*Primary Examiner*—Kevin J. Teska
*Assistant Examiner*—Samuel Broda
*Attorney, Agent, or Firm*—Staas & Halsey LLP

[57] ABSTRACT

A verification apparatus which verifies whether or not a finite state machine indicating the operation of a synchronous sequential machine satisfies the property indicating the functional specification repeats the image computation in the M and the computation of a set product by q starting with the state set p when the finite state machine M, the subset q of the state of the M, and the subset p of the q are given; and checks the relation of the state set of the computation process. As a result, it can be determined, starting with a certain state in the p, whether or not a state transition path which eternally does not exceed the q exists.

21 Claims, 14 Drawing Sheets

OTHER PUBLICATIONS

Fujita et al., "Application of BDD to CAD", 1993, pp. 610–611.

Hiraishi et al., "Formal Verification Method Based on Logical Function Process", 1994, pp. 710–718.

Minato, "BDD Process Technology Through Computer", 1993, pp. 593–599.

Ishiura, "Whats BDD?", 1993, pp. 585–592.

Kimura, "Formal Timing Verification", 1994, pp. 726–735.

Yosinori Watanabe et al., "Applications of Binary Decision Diagrams", May 1993, pp. 600–608.

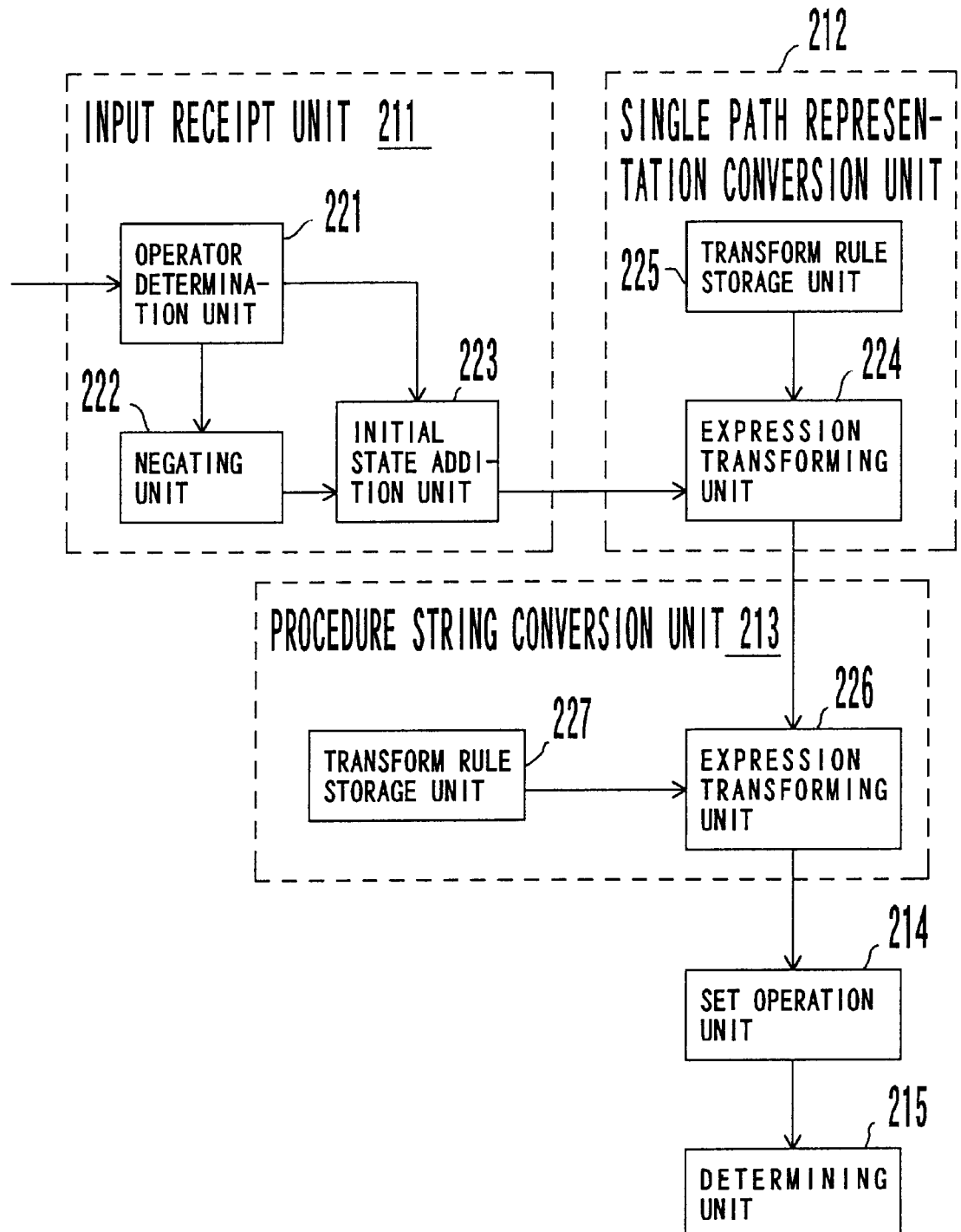
F I G. 1 B

FIG. 1C

$$\neg AG\ (p \rightarrow AF\ q) = \neg AG\ (\neg p \vee AF\ q)$$
$$= EF\neg\ (\neg p \vee AF\ q)$$
$$= EF\ (p \wedge \neg AF\ q)$$
$$= EF\ (p \wedge EG\neg q)$$

FIG. 1D

$$\underbrace{pi \wedge}_{b1} \underbrace{EF\ (p \wedge EG \neg q)}_{b2}$$

$$\rightarrow \{pi \wedge R\ (p \wedge EG\neg q),\ pi(True)^{*}\ R\ (p \wedge EG \neg q)\}$$
$$\rightarrow \{(pi \wedge p \wedge \neg q), pi(True)^{*}\ (p \wedge \neg q)\}\ (\neg q)^{\omega}$$

FIG. 1E

$$\{(pi \wedge p \wedge \neg q), pi(True)^{*}\ (p \wedge \neg q)\ \}\ (\neg q)^{\omega}$$

$\rightarrow$ FindLoop(FindTrail(S ( {pi$\wedge$p$\wedge\neg$q), pi(True)* (p$\wedge$q)} ), $\neg$q) $\wedge\neg$q)

$\rightarrow$ FindLoop(FindTrail(FindTrail(pi, (True))$\wedge$ (p$\wedge\neg$q), $\neg$q) $\wedge\neg$q)

$\rightarrow$ FindLoop(FindTrail(FindTrail(pi, (True)$\wedge$ p, $\neg$q) $\wedge\neg$q)

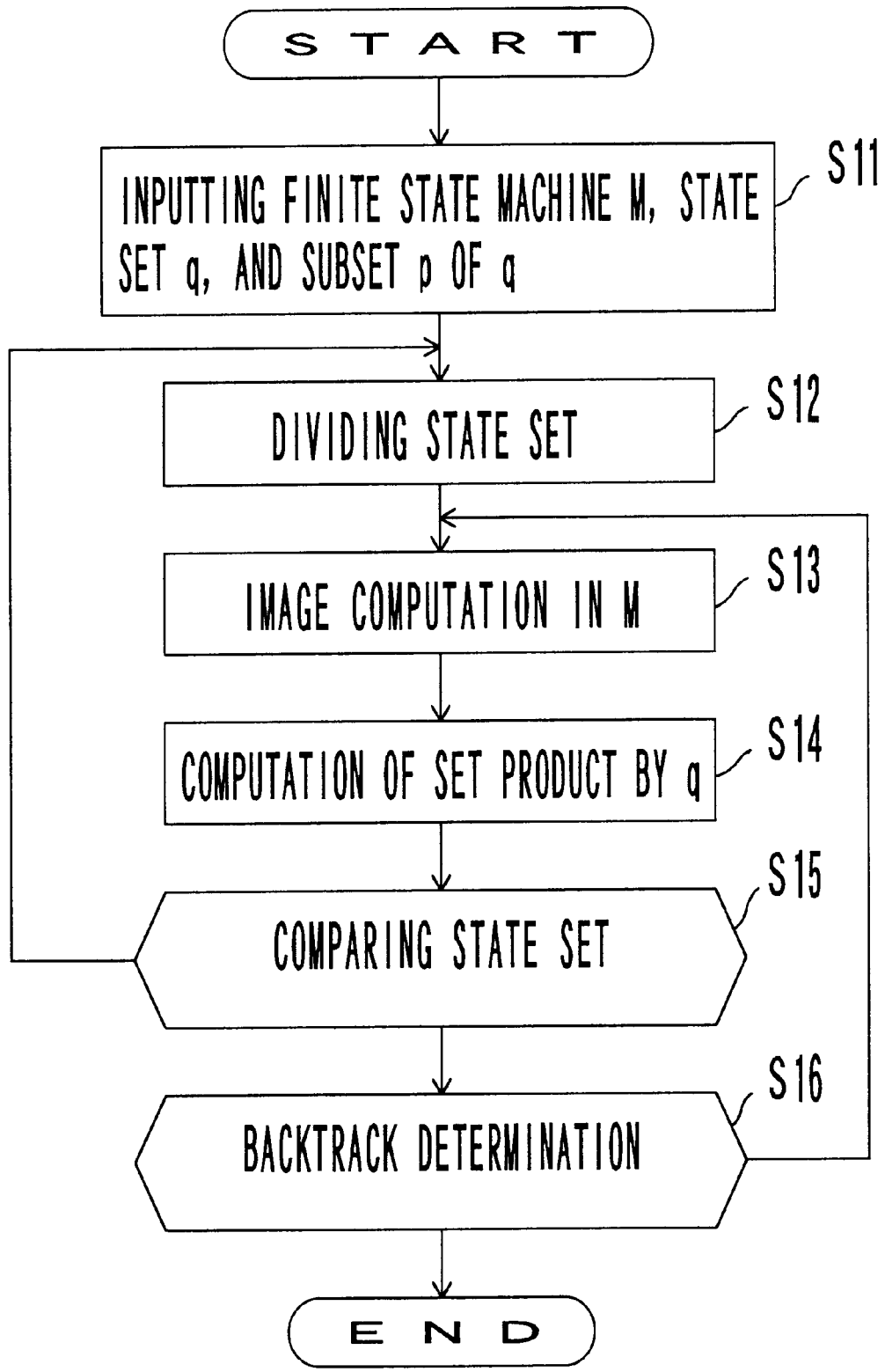
F I G. 2 B

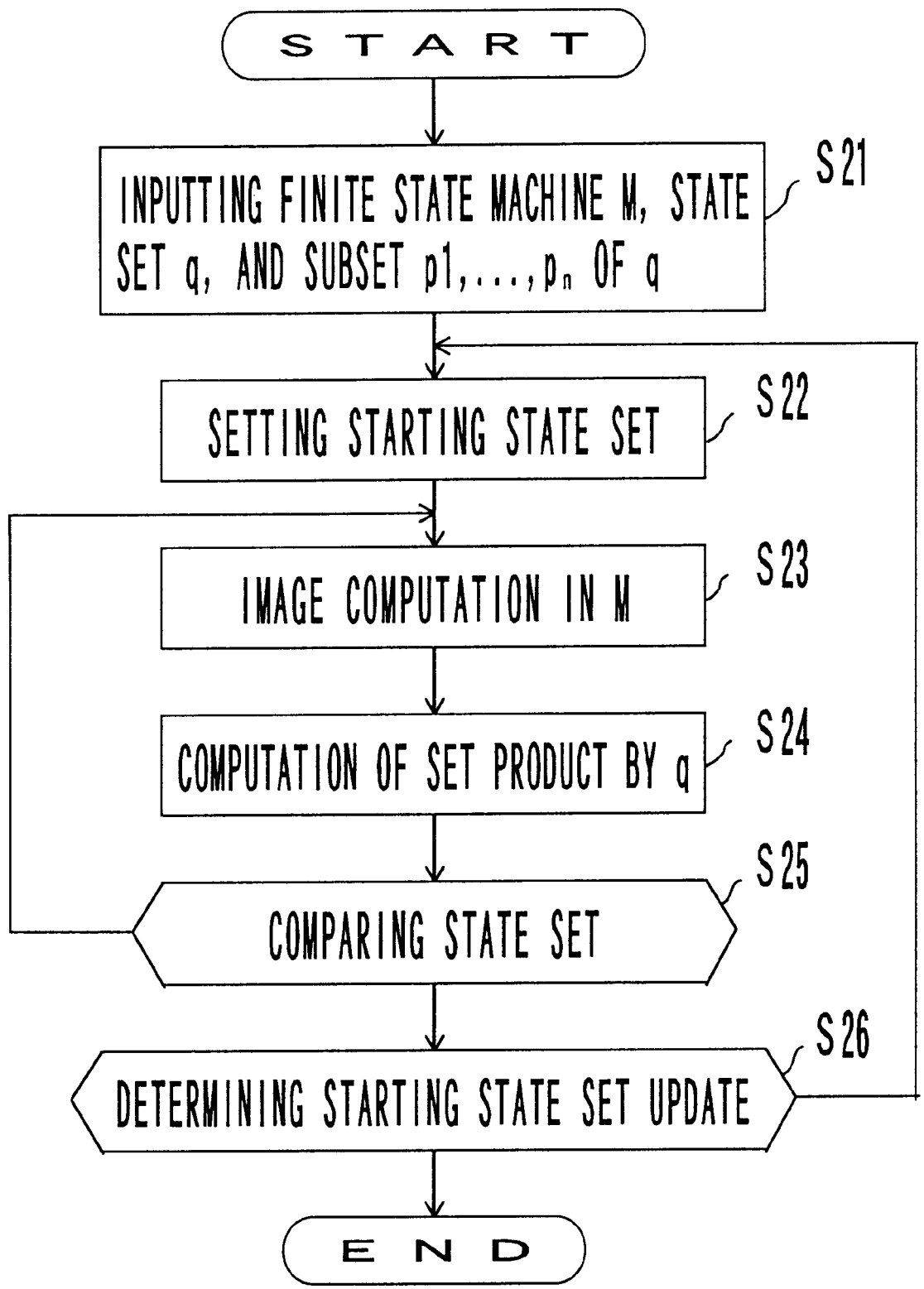
F I G. 3

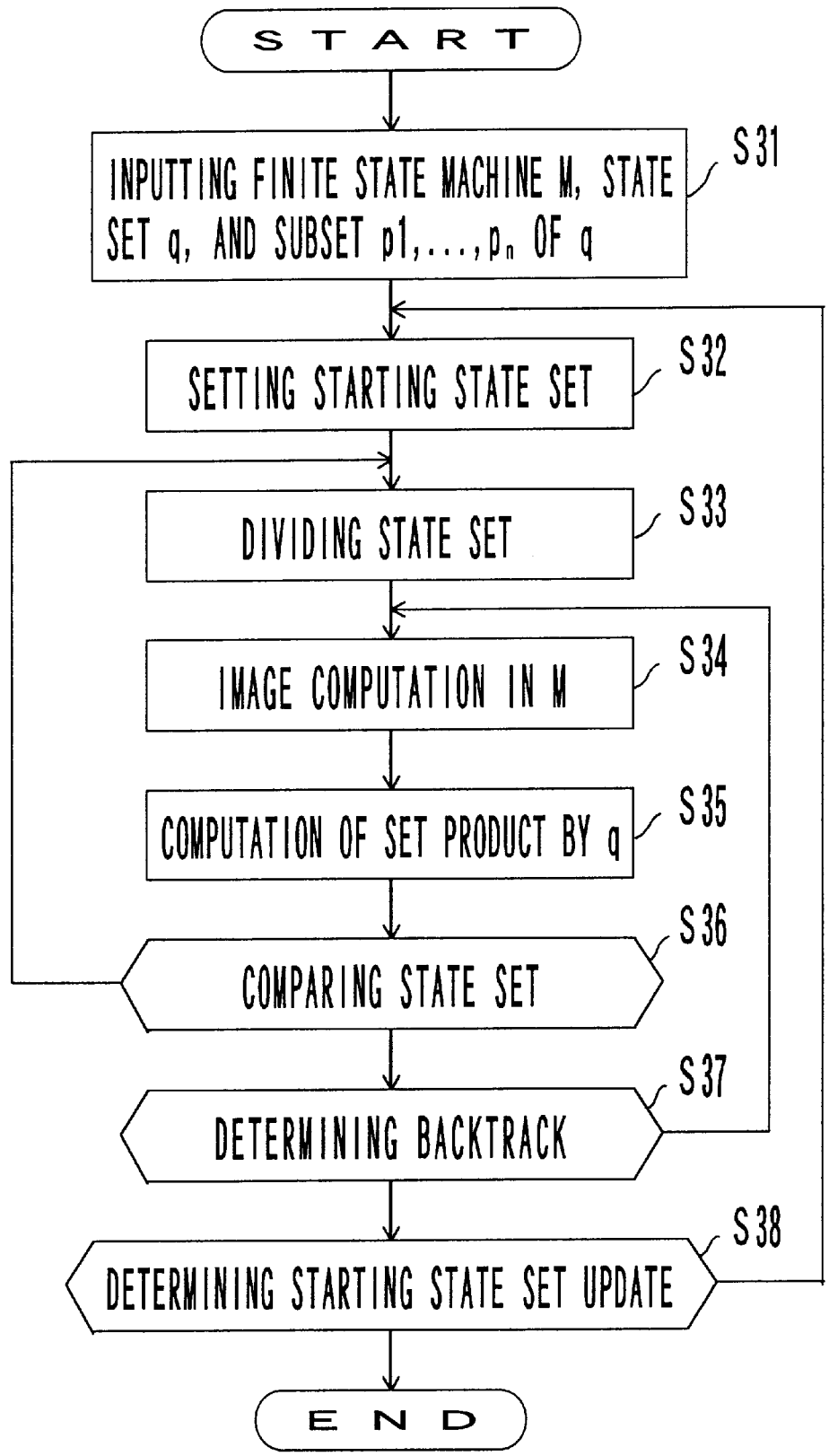
F I G. 4

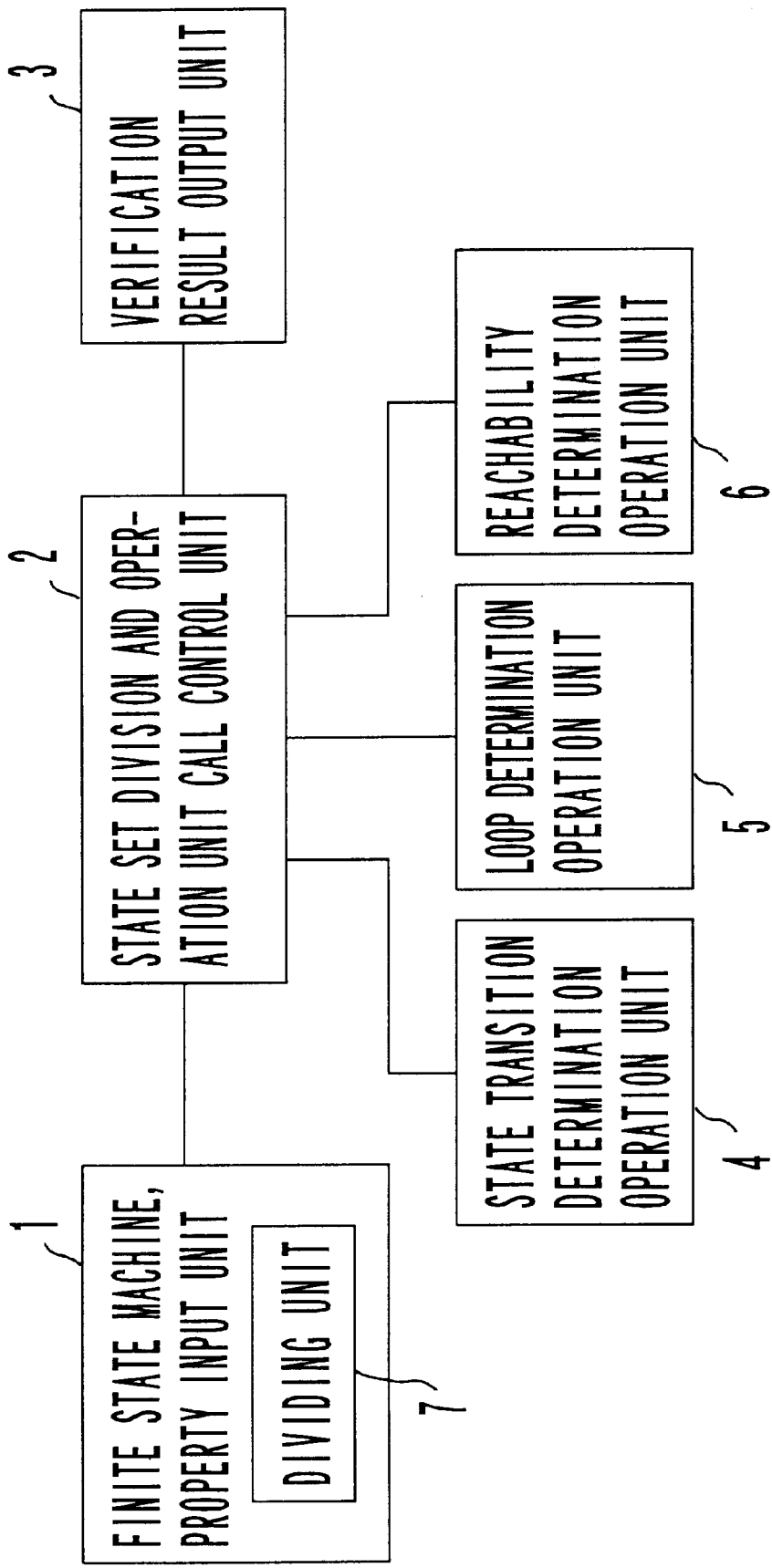
F I G. 5

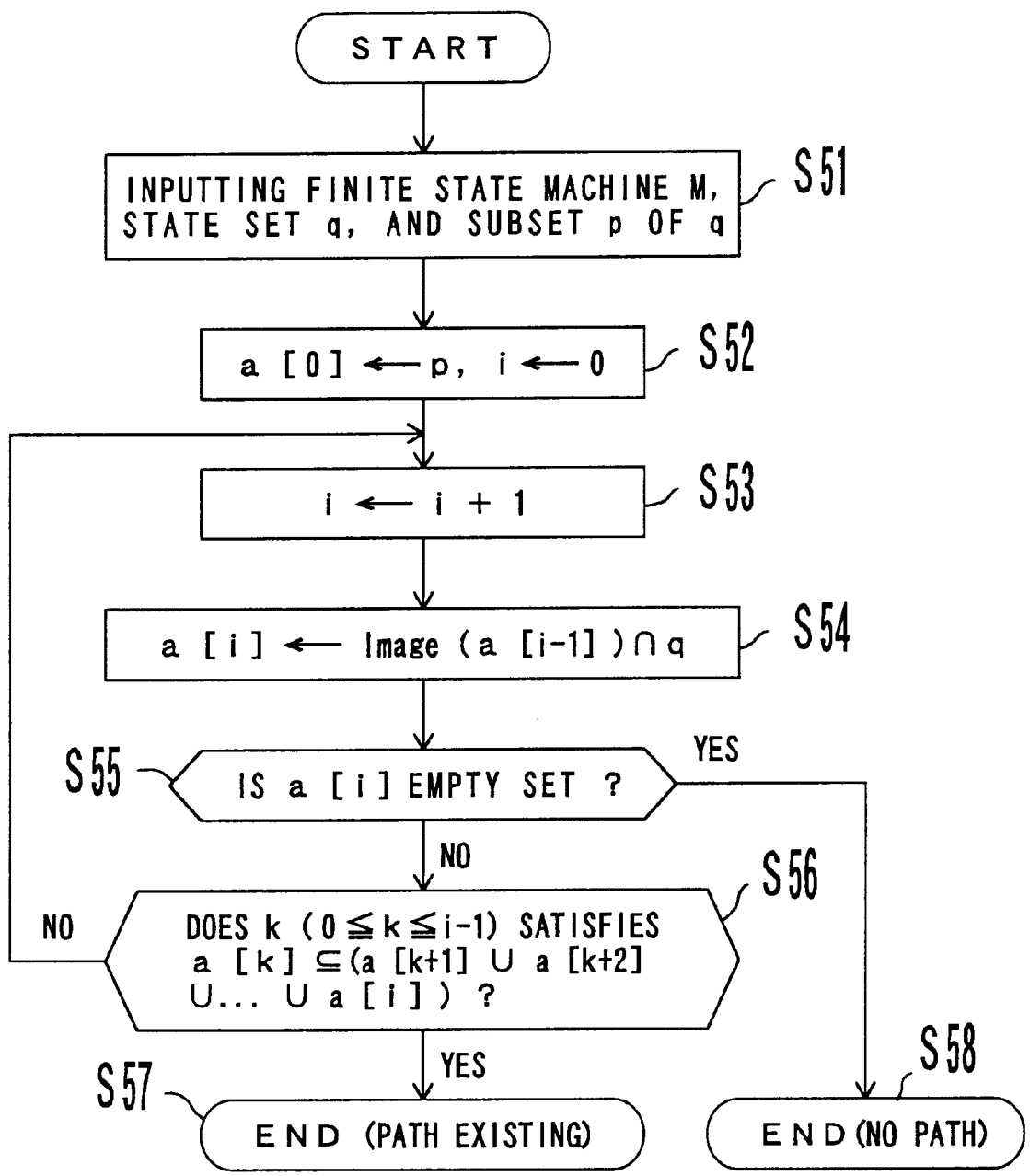
F I G. 7

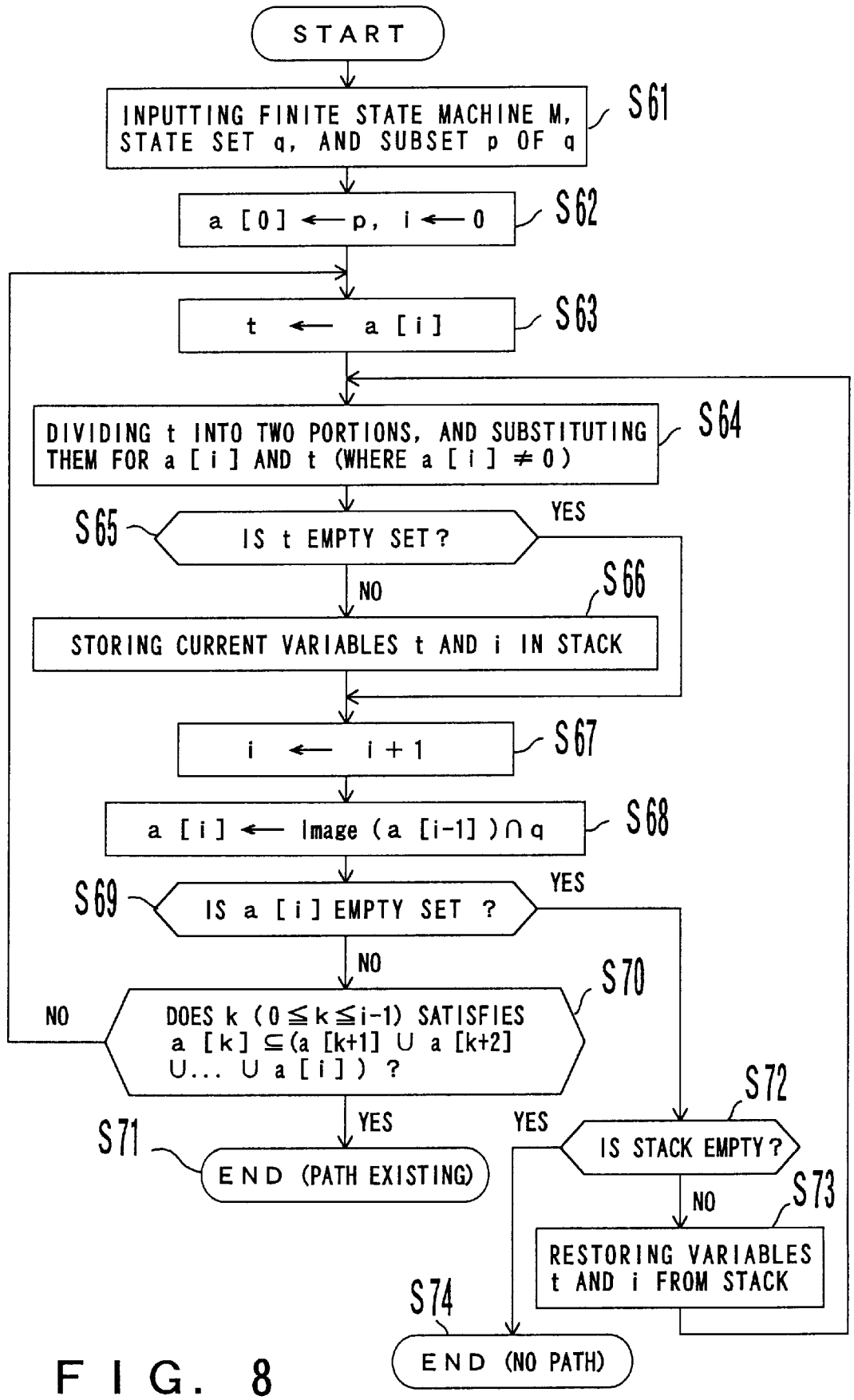
F I G. 8

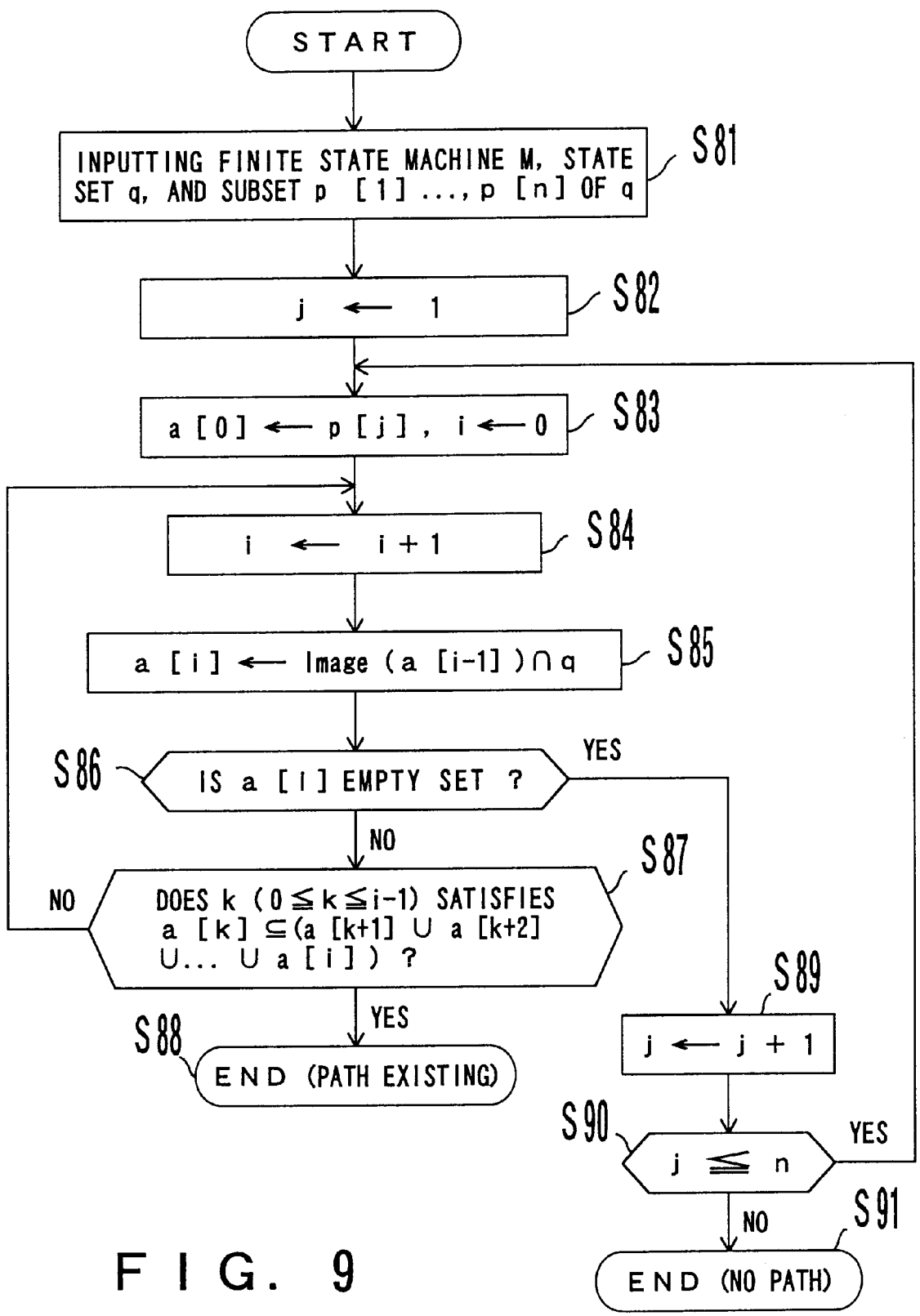
F I G. 9

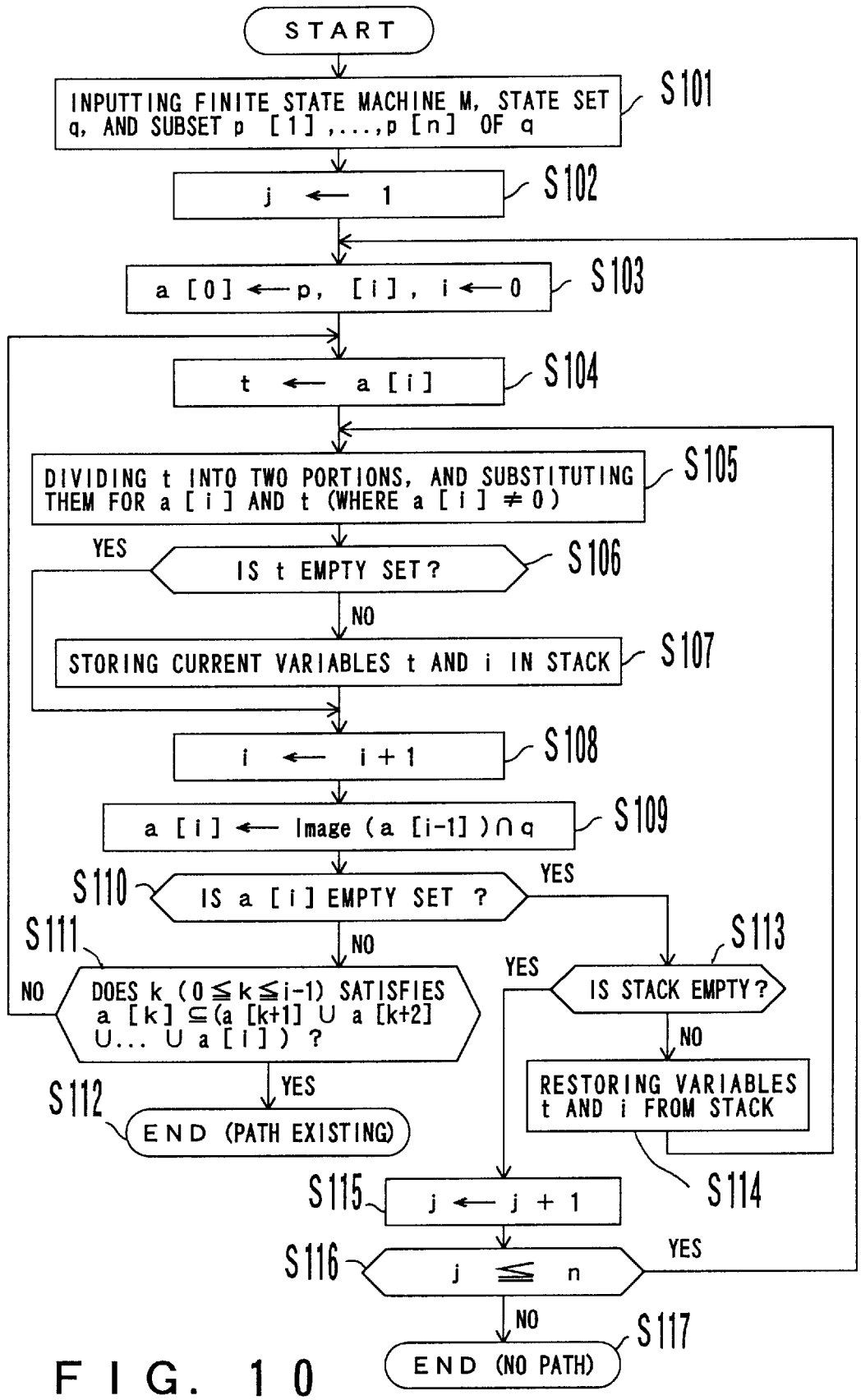
F I G. 1 0

LOGICAL DEVICE VERIFICATION METHOD AND APPARATUS

BACKGROUND OF THE INVENTION

FIELD OF THE INVENTION

The present invention relates to a method and an apparatus for verifying whether or not a model of a logical device provided with functional specification by a finite state machine.

A finite state machine is popularly used as a mathematical model of a synchronous order machine and protocol, and also relates to a method of verifying a synchronous sequential circuit and protocol. A well-known method of verifying whether or not the functional design of a logical device correctly represents its specification is a model checking method (refer to reference documents 2 and 5). This method mathematically proves that a finite state machine satisfies or does not satisfy the specification represented by a temporal logic.

The verifying operation of a logical device in the model checking method includes various steps from verifying abstract specification to operating a practical circuit. In these steps, since errors can be more easily detected in the verification of functional specification at the earliest stage in the logical device, it has been expected to perform a verifying process at a high speed and with high precision. Furthermore, the verifying process has been expected to be performed on a complicated logical device whose memory capacity reaches its limit in a common method.

Described below is the conventional technology.

§1: Explanation of conventional technology (1).

The above described finite state machine is defined as a finite automation with output. A common format of the finite state machine is obtained by the following equation (1).

$$M = (Q, \Sigma, \Phi, \delta, \lambda, I) \quad (1)$$

Each of the symbols has the following meaning.

Q: state set (finite)
$\Sigma$: input alphabet (finite)
$\Phi$: output alphabet (finite)
$\delta$: transition relation function
$\lambda$: output relation function
I: initial state set The above described transition relation function $\lambda$ is a function which determines the next state. It is set to 1 when the current state can be transient to the next state if the current state and an input are entered when the current state, the next state and an input can be entered to represent a nondeterministic transition. Otherwise, it is set to 0. When the transition is deterministic, the state transition can be represented as a function for obtaining the next state by the current state and an input. The above described output relation function $\lambda$ similarly corresponds to the case where an output is nondeterministic.

Basically, all synchronous sequential circuits can be modelled by the finite state machine. Therefore, when a logical device is designed, the finite state machine is popularly used as specification. For example, in synthesizing a logic, a state is commonly represented by a flip-flop circuit or a register by a synthesizing system converting the description of the specification of a device written in a design description language into a finite state machine, or a transition relation function $\delta$ and an output relation function $\lambda$ is commonly represented by a combinational circuit.

The basic logic of the above described finite state machine is described in detail in chapter 2 of the reference document 6. Verifying a device specified as a finite state machine is to check whether or not the device correctly represents the state transition of the finite state machine. An applicable technology to attain the verification can be logical simulation and formal verification.

The above described logical simulation is a process of simulating an operation by applying an appropriate input to a model of a device (description in design description language, gate level circuit chart, etc.). It is confirmed that an output obtained in the process matches the value obtained by the original finite state machine.

The above described formal verification is an approach to mathematically prove whether or not the property satisfied by the original finite state machine is completely satisfied by the model of the device. Typical examples are a symbol model check, symbol simulation, etc. The formal verification is described in detail in the reference documents 5, 3, 11, 13, and 8.

The above described formal verification (formal verification method) refers to a technology under development from the research stage to the practical stage, and several cases where the method is used in processor design verification have been reported. Among them, the symbol model checking method (refer to reference document 2) for verifying a control logic is considered to be the most practical method.

§2: Explanation of conventional technology (2) . . . refer to FIG. 1A.

FIG. 1A shows the conventional technology, that is, an example (1) of the finite state machine. In the above described formal verification methods, the symbol model checking method represents a logical device model of the Kripke structure using a logical function, checks whether or not a non-blank state set which satisfy the specification represented by a computation tree logic exist.

The Kripke structure is a kind of nondeterministic finite automaton represented by the following equation (2) using the finite set S of a state, the transition relation R of a state, the set $S_0$ of an initial state point, and the set L of an atomic proposition which is true in each state.

$$K = (S, R, S_0, L) \quad (2)$$

The computation tree logic is a kind of a temporal logic, and is represented by an operator A indicating 'universal', an operator E indicating 'existential', a temporal operator F indicating 'future', a temporal operator G indicating 'global', a temporal operator X indicating 'next', and a temporal operator U indicating 'until' in addition to a common logic operator.

For example, the temporal operator AGa indicates that the logical expression a exists in all state sets reachable from the initial state. In this case, in a model of a logical device, all paths reachable from the initial state are traced, and it is checked whether or not all the paths can reach the state in which the logical expression a exists.

That is, the verifying operation in the symbol model checking method is an operation of tracing the state transition of the Kripke structure and confirming whether or not the computation tree logic indicating the specification exists in each state. This operation refers to a set operation for obtaining the smallest floating point or the largest floating point in a model according to a computation tree logic expression.

The above described set operation can be realized by combining an image computation Image ({q}) for obtaining a state set reachable from a state set {q} in one state transition process with an inverse image computation Image$^{-1}(\{q\})$ for obtaining a state set reachable to a state set $\{q\}$ in one state transition process.

For example, in the example of the finite state machine represented by a state transition between nine states $q_0$ through $q_8$ as shown in FIG. 1A, examples of results of the image computation and the inverse image computation are represented by the following equations (3) through (6).

$$\text{Image}(\{q_0\})=\{q_0, q_1, q_2, q_3\} \quad (3)$$

$$\text{Image}(\{q_3, q_8\})=\{q_2, q_3, q_5, q_6, q_8\} \quad (4)$$

$$\text{Image}^{-1}(\{q_0\})=\{q_0, q_1\} \quad (5)$$

$$\text{Image}^{-1}(\{q_5\})=\{q_1, q_2, q_3, q_4\} \quad (6)$$

In the finite state machine shown in FIG. 1A, when the temporal logic AFp using the logical expression p indicating the state $q_7$ is verified, the image computation is sequentially repeated from the initial state $q_0$, and it is checked whether or not all paths transient from the initial state can actually reach the state $q_7$. When the temporal logic EFp is verified, the inverse image computation is repeated from the state $q_7$, and it is checked whether or not there is a path reaching the initial state $q_0$.

In a common actual symbol model checking method, a set operation is replaced with a logical function process (refer to reference document 5), and the logical function process becomes more efficient by representing the logical function by a binary decision diagram (refer to reference document 1).

§3: Explanation of conventional technology (3) . . . Refer to FIGS. 1B through 1H.

FIG. 1B shows the explanation (2) of the conventional technology. FIG. 1C shows the explanation (3) of the conventional technology. FIG. 1D shows the explanation (4) of the conventional technology. FIG. 1E shows the explanation (5) of the conventional technology. FIG. 1F shows the explanation (6) of the conventional technology. FIG. 1G shows the explanation (7) of the conventional technology. FIG. 1H shows the explanation (8) of the conventional technology. In the above described symbol model checking method, a property verification device (refer to Tokuganhei 8-220005) capable of both reducing the scale of memory and shortening a process time has already been suggested. This conventional technology is described below by referring to FIGS. 1B through 1H.

In FIG. 1B, the property verification device converts the computation tree logic expression accepted through an input receipt unit 211 as a logical expression input means into a single path representation through a single path representation conversion unit 212. Furthermore, the representation is converted by a procedure string conversion unit 213 into a procedure string described later and then provided for process by a set operation unit 214. A determining unit 215 determines whether or not the obtained state set is empty. Thus, the input property can be verified.

In the input receipt unit 211, an operator determination unit 221 transmits the computation tree logic expression to an initial state addition unit 223 directly or through a negating unit 222 depending on the leading operator in the received computation tree logic expression. When the leading operator is the operator A indicating 'universal', the operator determination unit 221 transmits the entire computation tree logic expression to the negating unit 222. When the leading operator is the operator E indicating 'existential', it transmits the expression to the negating unit 222.

The negating unit 222 negates the entire computation tree logic expression received from the operator determination unit 221, furthermore prepares the computation tree logic expression by transforming a necessary equation according to a logical operation rule, and transmits the obtained computation tree logic expression to the initial state addition unit 223. The initial state addition unit 223 transmits the computation tree logic expression to the single path representation conversion unit 212 as a starting state of the verifying operation by adding a proposition logical expression corresponding to the initial state to the head of the received computation tree logic expression.

In the single path representation conversion unit 212, an expression transforming unit 224 receives a computation tree logic expression from the above described input receipt unit 211, transforms the computation tree logic expression according to the transform rule stored in a transform rule storage unit 225, and converts is into a single path representation. The transform rule storage unit 225 stores the conversion rule R represented by the following equations (7) through (10) using, as the procedure for converting a computation tree logic expression into a single path representation, the proposition logical expressions p and q indicating a state set, and a partial expression f of the above described computation tree logic expression.

$$R(p \wedge \text{EX} f) = pR(f) \quad (7)$$

$$R(p \wedge \text{EF} f) = \{R(p \wedge f), p\text{True}^*R(f)\} \quad (8)$$

$$R(p \wedge \text{EG} q) = (p \wedge f)q\,\omega \quad (9)$$

$$R(p \wedge \text{E}(q \cup f)) = \{R(p \wedge f), pq^*R(f)\} \quad (10)$$

In the above listed equations (7) through (10), the finite and infinite repetition of the proposition logical expression p is represented by an index symbols * and ω. Each case group is enclosed by { }. The expression transforming unit 224 detects the portion applicable to the above described conversion rule in the received computation tree logic expression. An applicable conversion rule is applied to perform a conversion process to perform a converting process for a unit path representation.

The single path representation refers to a single non-branch state set string or a state set string obtained by linking a state set string which is an infinite loop to a single non-branch state set string. The state set S of a single path representation s is defined as follows using the set P of the proposition logical expression indicating an optional state set.

1: The state set where p∈P is a single path representation.

2: The connection ps between the state set where p∈P and the state set string s where s∈S is a single path representation.

3: The infinite repetition pω of the state set p where p∈P is a single path representation.

4: The connection p* between the finite repetition p* of the state set p where p∈P and the state set string s where s∈S is a single path representation.

Therefore, the expression transforming unit 224 transforms the expression according to the above described conversion rule, and obtains the state set string indicated by a single path representation. For example, when a computation tree logic expression AG (p→AFq) indicating the property to be verified through the input receipt unit 211 is input, the leading operator is the operator A indicating 'universal'. Therefore, the negating unit 222 operates at an instruction from the operator determination unit 221, and first negates an input computation tree logic expression and then prepares it as shown in FIG. 1C, thereby obtaining a computation tree logic expression not including the operator A.

Furthermore, the initial state addition unit 223 adds the proposition logical expression pi corresponding to the initial state to the head of the computation tree logic expression to provide the obtained computation tree logic expression for use in the process to be performed by the expression transforming unit 224. In response to the input of the computation tree logic expression, the expression transforming unit 224 starts its operations to sequentially apply the above listed equations (8) and (9) to a partial expression indicated by each underline as shown in FIG. 1D. Thus, the single path representation shown in FIG. 1D can be obtained.

In the procedure string conversion unit 213, an expression transforming unit 226 converts a single path representation into the verification procedure string described below according to the conversion rule stored in a transform rule storage unit 227. A basic verification procedure string simply contains image computation. Equation (13) is represented from the following equation (11) using the propositions p and q, the operator Image indicating the image computation, and the operators gfp lfp indicating the largest floating point and the smallest floating point.

$$\text{FindTrans}(p) = \text{Img}(p) \tag{11}$$
$$\text{FindTrail}(p,q) = \text{lfp } Z. \ [p \lor \text{Img}(q \land Z)] \tag{12}$$
$$\text{FindLoop}(p) = \text{gfp } Z. \ [p \land \text{Img}(Z)] \tag{13}$$

The verification procedure FinfTrans(p) appearing in the above listed equation (11) is the very image computation. As shown in FIG. 1F, a reachable state set is returned in one state transition process from the state set represented by the proposition logic expression p. The verification procedure FindTrail(p,q) in the above listed equation (12) is a procedure of returning a state set (indicated by diagonal lines in FIG. 1G) reachable from the state set represented by the proposition logical expression p through a state set in which the proposition logical expression q exists as shown in FIG. 1G.

The verification procedure FindLoop(p) in the above listed equation (13) is a procedure of returning a union (indicated by diagonal lines in FIG. 1H) of a subset, which is contained in the state set represented by the proposition logical expression p as shown in FIG. 1H and forms a loop in which the proposition logical expression p exists, and a subset reachable from the loop. The transform rule storage unit 227 stores a conversion rule S represented by the following equations (14) through (18).

$$S(p) = p \tag{14}$$
$$S(sp) = \text{FindTrans}(S(s)) \land p \tag{15}$$
$$S(sp^*) = \text{FindTrail}(\text{FindTrans}(S(s),p)) \tag{16}$$
$$S(sp\omega) = \text{FindLoop}(\text{FindTrail}((S(s),p) \land p)) \tag{17}$$
$$S(\{s \land p, sp^*\}) = \text{FindTrail}(S(s),p) \tag{18}$$

Therefore, the expression transforming unit 226 detects from the received single path representation a portion to which the conversion rules apply, and sequentially applies a corresponding conversion rule so that the single path representation can be converted into a verification procedure string. For example, in response to the single path representation shown in FIG. 1D, the expression transforming unit 226 sequentially applies the above listed equations (17) and (18) and prepares the equations to convert the representation into a procedure string as shown in FIG. 1E.

In response to the received procedure string, the set operation unit 214 performs an image computation and a floating point computation in the above listed equations 11 through 13, obtains a state set indicated by a single path representation, inputs it to the determining unit 215 to determine whether or not the state set is an empty set.

Since these procedure strings are executable using only image computation as described above, it can be verified whether or not a model of a logical device realizes the property which can be represented by a single path representation by performing a set operation process through the performance of a practical computer system even when the scale of a binary decision diagram is reduced by representing the state transition relation using a function.

Thus, relating to the property which can be represented by a single path representation, the memory requirements can be reduced and the process time can be shortened to solve the problems arising when a symbol model checking method is applied. As a result, the symbol model checking method can be applied to the property verification of a logical device having practical rules.

The above described conventional technologies have the following problems.

(1): In the symbol model checking method, the operation of a finite state machine is represented by a logical expression, and the verification procedure is realized in a logical function process. In this process, a binary decision diagram (BDD) is used as a representation format of a logical function. The number of states of the finite state machine used in the design verification may exceed $10^{20}$, and requires an implicit representation method using a logical function and an effective logical function process using the BDD.

However, when a process contains a number of states and a device processes complicated state transition, there arises the problem that the size of the BDD indicating the transition relation of a finite state machine and the size of the BDD generated during the logical function process are enlarged. The size of a BDD can be measured by the number of nodes of the BDD. In the worst case, a variable may increase like an index.

(2): The above described problem (1) can be attenuated by the property verification device (refer to Tokuganhei 8-220005). However, if the device is more complicated, the scale of the BDD may reach the limit. Relating to a part of the property, the scale of the BDD can be reduced by dividing the state set during the verification procedure (refer to reference documents 10 and 12). In this procedure, the state enumeration process (refer to reference document 5) is performed by repeating the image computation from the initial state within a limited storage capacity.

Since a common symbol model check is based on the inverse image computation (refer to reference document 5), this method is limited in application. On the other hand, since the above described property verification device (refer to Tokuganhei 8-220005) is based on the image computation, it is applicable in various fields. With the above described property verification device (refer to Tokuganhei 8-220005), the procedure of FindTrail() is based on the state enumeration, and can divide a state set for computation.

Furthermore, it is easy to divide a state set of FindTrans() for computation. However, FindLoop() refers to a procedure quite different from the state enumeration, and is not allowed to divide a state set for a process. Therefore, in most cases, the method of dividing a state set does not work for reduction of a storage capacity in the symbol model checking method.

§4: Reference documents.

(reference document 1): R. E. Bryant. Graph based algorithm for boolean function manipulation. IEEE Trans. Comput., C-35 (8): 677–691, 1986.

(reference document 2): E. M. Clarke, E. A. Emerson, and A. P. Sistla. Automatic verification of finite-state concurrent systems using temporal logic specifications. ACM Trans. Prog. Lang. Syst., 8 (2): 244–263, 1986.

(reference document 3): Fujita, Chen, and Yamazaki. Example of application to actual design of formal verification method. Information process, 35 (8): 719–725, 1994.

(reference document 4): Fujita and E. M. Clarke. Application of BDD to CAD. Information process, 34 (5): 609–616, 1993.

(reference document 5): Hiraishi and Hamaguchi. Formal verification method based on logical function process. Information process, 35 (8): 710–718, 1994.

(reference document 6): J. E. Hopcroft and J. D. Ullman. Introduction to Automata Theory, Languages, and Computation. Addison-Wesley Publishing Company, 1979.

(reference document 7): Minato. BDD process technology through computer. Information process, 34 (5): 593–599, 1993.

(reference document 8): Taniguchi and Kitamichi. Specification description, design, and verification through algebraic method. Information process. 35 (8): 742–750, 1994.

(reference document 9): Ishiura. What's BDD? Information process. 34 (5): 585–592, 1993.

(reference document 10): H. Iwashita, S. Kowatari, T. Nakata, and F. Hirose. Automatic test program generation for pipelined processors. In Proceedings of the International Conference on Computer-Aided Design, pp. 580–583, 1994.

(reference document 11): Kimura. Formal timing verification. Information process. 35 (8): 726–735, 1994.

(reference document 12): K. Ravi and R. Somenzi. High-density reachability analysis. In Proceedings of the International Conference on Computer-Aided Design, pp. 154–158, 1995.

(reference document 13): Takahara. Formal verification through process algebra. Information process. 35 (8): 736–741, 1994.

(reference document 14): Watanabe and Kukimoto. Application of BDD. Information process. 34 (5): 600–608, 1993.

SUMMARY OF THE INVENTION

The present invention aims at providing a logical device verification method and apparatus capable of reducing a storage capacity and verifying a complicated logical device using a state set dividing method.

The logical device verification apparatus according to the present invention includes an input unit, an output unit, a state transition determination operation unit, a reachability determination operation unit, a loop determination operation unit, and a control unit.

In the first phase of the present invention, the input unit inputs a finite state machine M and the property relating to the M. The output unit outputs a verification result. The state transition determination operation unit obtains a state set reachable in a single state transition from an element of a state set p. The reachability determination operation unit obtains a reachable state set through an element of a set state q from an element of the state set p. The loop determination operation unit starts with a certain state in p, and determines whether or not there is a path of a state transition not exceeding g. The control unit divides the state set, calls the state transition determination operation unit, a reachability determination operation unit, and a loop determination operation unit, and obtains a path of a state transition corresponding to the property.

BRIEF DESCRIPTION OF THE DRAWINGS

FIG. 1B is an explanatory view (2) of the conventional technology;

FIG. 1C is an explanatory view (3) of the conventional technology;

FIG. 1D is an explanatory view (4) of the conventional technology;

FIG. 1E is an explanatory view (5) of the conventional technology;

FIG. 2B shows the principle (2) of the present invention;

FIG. 3 shows the principle (3) of the present invention;

FIG. 4 shows the principle (4) of the present invention;

FIG. 5 shows the verification apparatus according to an embodiment of the present invention;

FIG. 7 is a process flowchart according to the embodiment 1 of the present invention;

FIG. 8 is a process flowchart according to the embodiment 2 of the present invention;

FIG. 9 is a process flowchart according to the embodiment 3 of the present invention;

FIG. 10 is a process flowchart according to the embodiment 4 of the present invention;

DESCRIPTION OF THE PREFERRED EMBODIMENTS

The present invention has been developed to solve the above described problems, use the state set dividing method in the symbol model checking method, reduce a storage capacity, and verify a complicated logical device.

Embodiments of the present invention are described below in detail by referring to the attached drawings.

FIGS. 2A through 4 are explanatory views 1 through 4 of the present invention. The present invention has the following configuration to attain the above described objects.

A logical device verification method for verifying whether or not a finite state machine indicating the operation of a synchronous sequential machine satisfies the property indicating the functional specification includes the steps of: repeating the image computation in the M and the computation of a set product by q starting with the state set p when the finite state machine M, the subset q of the state of the M, and the subset p of the q are given; and checking the relation of the state set of the computation process. As a result, it can be determined, starting with a certain state in the p, whether or not a state transition path which eternally does not exceed the q exists.

Figure 1A:
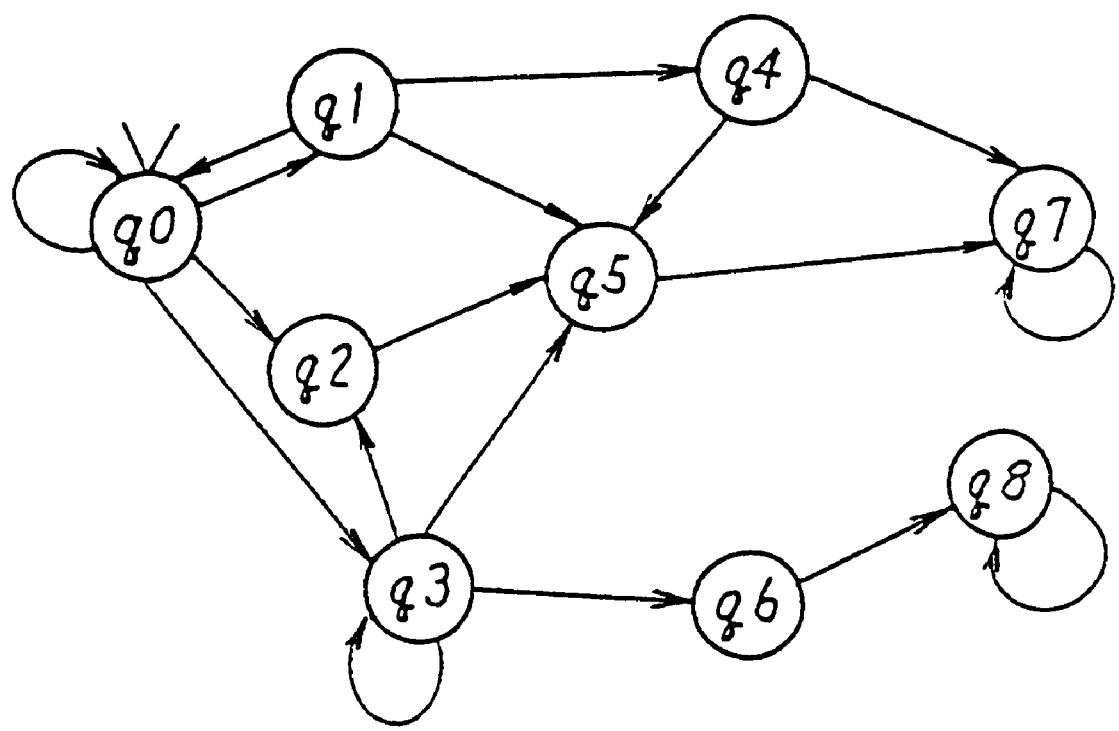
FIG. 1A is an explanatory view (1) of the conventional technology.
Figure 1F:
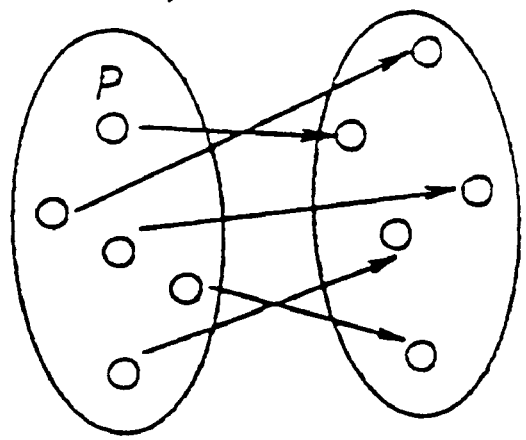
FIG. 1F is an explanatory view (6) of the conventional technology.
Figure 1G:
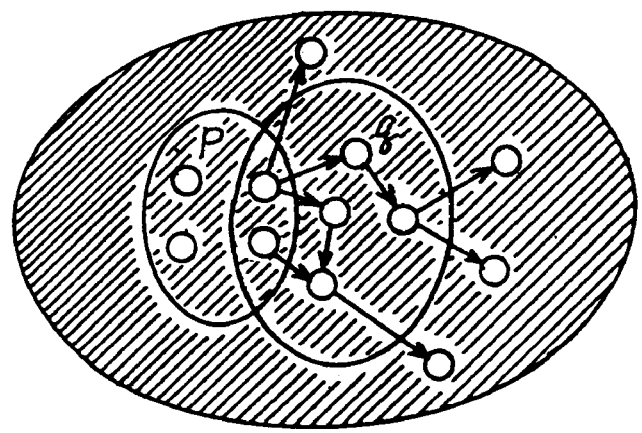
FIG. 1G is an explanatory view (7) of the conventional technology.
Figure 1H:
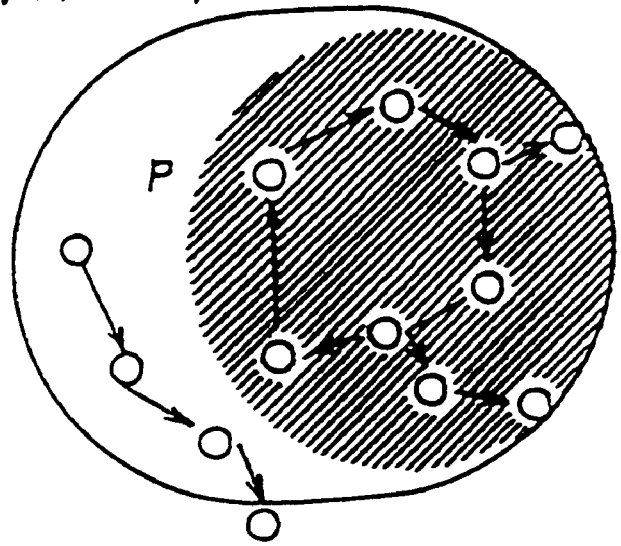
FIG. 1H is an explanatory view (8) of the conventional technology.
Figure 2A:
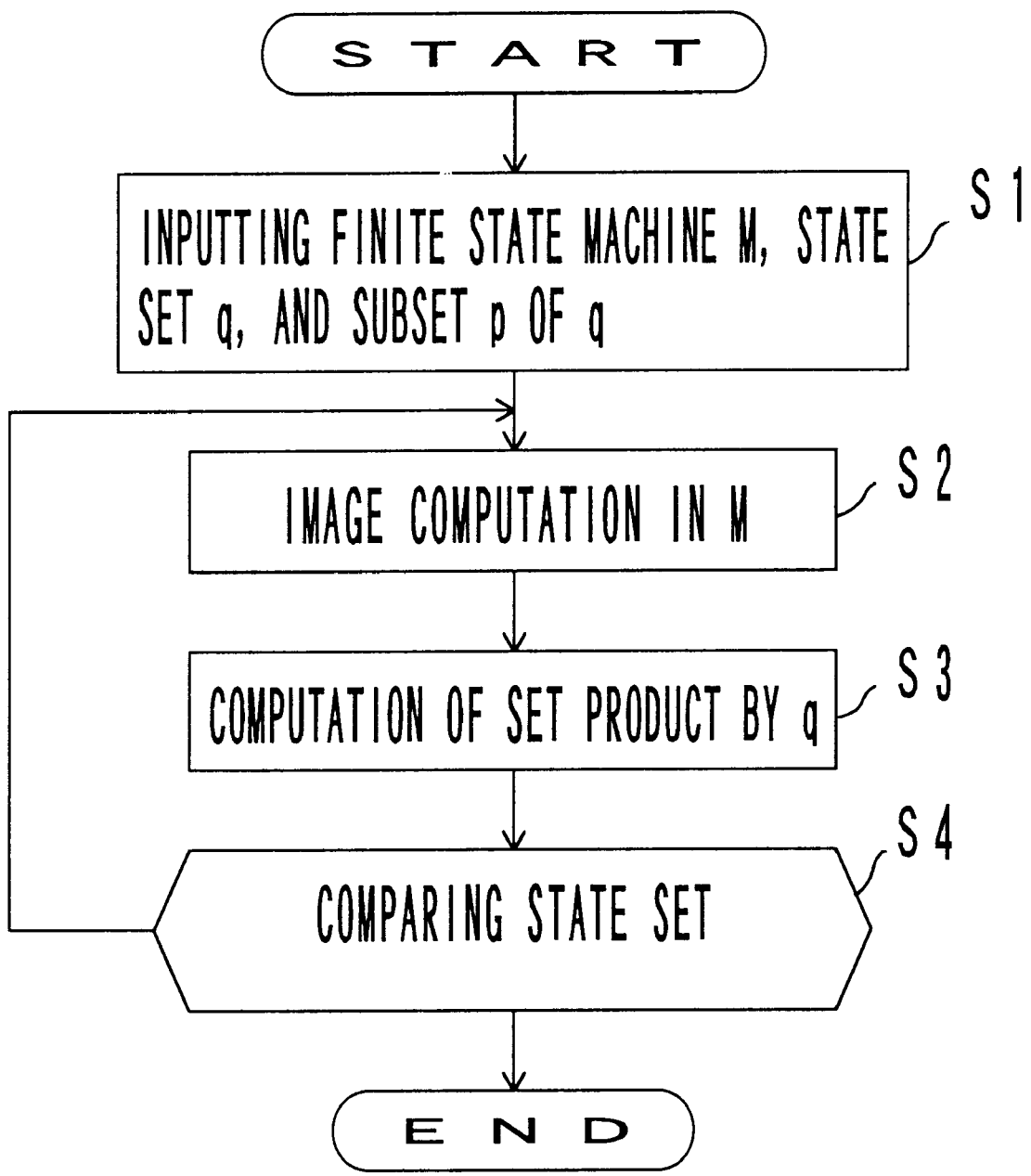
FIG. 2A shows the principle (1) of the present invention.

Each process step is described below by referring to FIG. 2A.

When the finite state machine M, the subset q of the state of the M (state set q), and the subset p of the q are input (S1) in the logical device verification apparatus, the image computation is performed in the finite state machine M (S2), and the set product computation is performed (S3). While the processes in S2 and S3 are repeatedly performed, the relation of the state set of the computation process is checked through the comparison of a state set (S4). Thus, it is determined, starting with a certain state in the p, whether or not a state transition path which eternally does not exceed the q exists.

Thus, a basic algorithm of dividing a state set for computation is provided in the process of determining whether or not a state transition path which eternally does not exceed the q starting from a certain state in the p. In most cases of a symbol model check, a state set dividing method can be used. Therefore, a storage capacity can be reduced, and a complicated logical device can be verified.

Furthermore, a logical device verification method for verifying whether or not a finite state machine indicating the operation of a synchronous sequential machine satisfies the property indicating the functional specification includes the steps of: recursively repeating the division of a state set, the image computation in the M, the computation of a set product by q with the depth processed by priority starting with the state set p when the finite state machine M, the subset q of the state of the M, and the subset p of the q are given; and checking the computation process. As a result, it can be determined, starting with a certain state in the p, whether or not a state transition path which eternally does not exceed the q exists.

Each process step is described below by referring to FIG. 2B.

When the finite state machine M, the subset q of the state of the M, and the subset p (state set p) of the q are input (S11) in the logical device verification apparatus, repeated are the division of a state set (S12), the image computation in the M (S13), the computation of a set product by q (S14), and the state set comparison (S15). That is, recursively repeated are the division of a state set, the image computation in the M, the computation of a set product by q with the depth processed by priority starting with the state set p. Then, the computation process is checked by the state set comparison. As a result, it can be determined, starting with a certain state in the p, whether or not state transition paths which eternally do not exceed the q exist.

If any one of the above described paths can be detected, the process immediately terminates. However, when the path does not exist, a backtrack determination is made (S16). When the process termination conditions are not satisfied, the divided and remaining state set is processed again starting with the process in S13.

Thus, an algorithm of dividing a state set for each repeated computation is provided in the process of determining whether or not a state transition path which eternally does not exceed the q starting from a certain state in the p. Therefore, a storage capacity can be reduced by the division of the state set.

Furthermore, a logical device verification method for verifying whether or not a finite state machine indicating the operation of a synchronous sequential machine satisfies the property indicating the functional specification includes the steps of: repeating the image computation in the M, the computation of a set product by q starting with the state set p with each of subsets p1, p2, . . . , pn set as p when the finite state machine M, the subset q of the state of the M, and the subset p1, p2, . . . , pn of the q are given; and checking the relation of the state set of the computation process. As a result, it can be determined, starting with a certain state in the p1∪p2∪p3 . . . ∪pn, whether or not a state transition path which eternally does not exceed the q exists.

Each process step is described below by referring to FIG. 3.

When the finite state machine M, the subset q of the state of the M, and the subset p1, p2, . . . , pn (already divided subset) of the q are input (S21) in the logical device verification apparatus, a starting state set is defined (S22) with the subset p1, p2, . . . , pn individually set as p (state set). Then repeated are the image computation in the M (S23), the computation of a set product by q (S24), and the state set comparison (S25) starting with the state set p.

Thus, the image computation in the finite state machine M is performed on the defined starting state set, and then the set product by q is computed. While the processes in steps S23 and S24 are repeatedly performed, the relation of the state set in the computation process is checked through comparison so that it is determined whether or not state transition paths which eternally do not exceed the q exist.

As a result, if any one of the above described paths can be detected, the process immediately terminates. However, when the path does not exist, a starting state set update determination is made (S26). When the update is required, the processes are repeated starting with the process in step S22. That is, the image computation in the M, the computation of a set product by q are repeated starting with the state set p, and the relation of the state set of the computation process is checked. As a result, it can be determined, starting with a certain state in the p1∪p2∪p3 . . . ∪pn, whether or not a state transition path which eternally does not exceed the q exists.

Thus, an algorithm of separately, not collectively, computing the p when it is divided into p1, p2, . . . , pn is assigned in the process of determining whether or not a state transition path which eternally does not exceed the q starting from a certain state in the p. Therefore, also in this case, a storage capacity can be reduced by the division of the state set.

Furthermore, a logical device verification method for verifying whether or not a finite state machine indicating the operation of a synchronous sequential machine satisfies the property indicating the functional specification includes the steps of: recursively repeating the division of a state set, the image computation in the M, and the computation of a set product by q with the depth processed by priority starting with the state set p with each of p1, p2, . . . , pn set as p when the finite state machine M, the state set q of the state of the M, and the subset p1, p2, . . . , pn of the q are given; and checking the relation of the state set of the computation process. As a result, it can be determined, starting with a certain state in the p1∪p2∪p3 . . . ∪pn, whether or not a path which eternally does not exceed the q exists.

Each process step is described below by referring to FIG. 4.

When the finite state machine M, the subset q of the state of the M, and the subset p1, p2, . . . , pn (already divided subset) of the q are input (S31) in the logical device verification apparatus, a starting state set is defined (S32) with the subset p1, p2, . . . , pn individually set as p (state set). Then, recursively repeated are the division of a state set (S33), the image computation in the M (S34), the computation of a set product by q (S35) with the depth processed by priority starting with the state set p. Then, the computation process is checked by the state set comparison (S36). As a result, it can be determined, starting with a certain state in the p1∪p2∪p3 . . . ∪pn, whether or not a path which eternally does not exceed the q exists.

If any one of the above described paths can be detected, the process immediately terminates. However, when the path does not exist, a backtrack determination is made (S37). When the process termination conditions are not satisfied, the divided and remaining state set is processed again starting with the process in S34. If any one of the above described paths can be detected, the process immediately terminates. However, when the path does not exist, a starting state set update determination is made (S38) when the process termination conditions are satisfied, and the processes are repeated starting with the process in step S32 until the starting state set update is not required. However, if any one of the above described paths can be detected, the process immediately terminates.

Thus, an algorithm of separately, not collectively, computing the p when it is divided into p1, p2, . . . , pn is assigned in the process of determining whether or not a state transition path which eternally does not exceed the q starting from a certain state in the p. Therefore, also in this case, a storage capacity can be reduced by the further division of the state set during the computation.

Furthermore, a logical device verification apparatus for verifying whether or not a finite state machine indicating the operation of a synchronous sequential machine satisfies the property indicating the functional specification includes an input unit for inputting a finite state machine M and property relating to the M; an output unit for outputting a verification result; a state transition determination operation unit for obtaining a state set reachable in a single state transition from an element of a state set p; a reachability determination operation unit for obtaining a reachable state set through an element of a set state q from an element of the state set p; a loop determination operation unit for starting with a certain state in p, and determining whether or not there is a path of a state transition not exceeding q; and a control unit for dividing the state set, calling each of the above described operation units, and obtaining a path of a state transition corresponding to the property.

When the finite state machine M and the property relating to the M are input in the logical device verification apparatus, the input unit receives the input data, and transfers the input data to the control unit after dividing the input data if preliminary division is required. However, if the preliminary division is not required, the data is transferred as is directly to the control unit.

Then, the control unit divides the state set when it receives the input data, calls each of the operation units, and outputs to the verification result output unit the verification result obtained through a verifying process. At this time, when the state transition determination operation unit is called, an operation of obtaining a state set reachable from an element of the state set p in one state transition process is performed, and the operation result is returned to the control unit.

When the reachability determination operation unit is called, an operation of obtaining a state set reachable from an element of the state set p through an element of the state set q is performed, and the operation result is returned to the control unit. Furthermore, when the loop determination operation unit is called, an operation is performed to determine, starting with a certain state in the p, whether or not a state transition path which eternally does not exceed the q exists. The operation result is returned to the control unit.

Thus, a state set dividing method can be used in the symbol model checking process. Therefore, a storage capacity can be reduced, and a complicated logical device can be verified.

Furthermore, a storage medium stores a program, in a verifying process for verifying whether or not a finite state machine indicating the operation of a synchronous sequential machine satisfies the property indicating the functional specification, for repeating the image computation in the M, the computation of a set product by q starting with the state set p when the finite state machine M, the subset q of the state of the M, and the subset p of the q are given, and for checking the state set relation of the computation process. As a result, it can be determined, starting with a certain state in the p, whether or not a state transition path which eternally does not exceed the q exists.

A process similar to each of the process steps (S1 through S4) described above by referring to FIG. 2A can be realized by reading and executing the program stored on the above described storage medium. That is, in a logical device verification apparatus for verifying whether or not a finite state machine indicating the operation of a synchronous sequential machine satisfies the property indicating the functional specification, repeated are the image computation in the M, the computation of a set product by q starting with the state set p when the finite state machine M, the subset q of the state of the M, and the subset p of the q are given. Then, the state set relation of the computation process is checked. As a result, it can be determined, starting with a certain state in the p, whether or not a state transition path which eternally does not exceed the q exists.

Thus, in the process of determining whether or not, starting with a certain state in the p, a state transition path which eternally does not exceed the q exists, a basic algorithm of dividing a state set for computation is provided. In most cases of a symbol model check, a state set dividing method can be used.

With the above described configuration, the following features are obtained. That is, in a logical device verification apparatus, the image computation in the M and the computation of a set product by q are repeated starting with the state set p when the finite state machine M, the subset q of the state of the M, and the subset p of the q are given. Then, the relation of the state set of the computation process is checked. As a result, it can be determined, starting with a certain state in the p, whether or not a state transition path which eternally does not exceed the q exists.

Therefore, in most cases of a symbol model check, a state set dividing method can be used. In the state set dividing method, the verifying process can be performed on a complicated logical device whose memory capacity reaches its limit in a common method. The problem of the storage capacity is serious because it relates to the practicality of a symbol model check, and the present invention contributes to the realization of this practicality.

Furthermore, at the initial stage of the dividing operation, negative or positive examples may be detected. Therefore, for example, at the initial stage of the logical verification in which a number of erroneous designs can be detected, an erroneous design can be detected more quickly according to the present invention than in a method followed without the dividing operation.

FIG. 5 is an explanatory view of the verification apparatus for verifying a logical device. This apparatus is an example of a logical device verification apparatus (also referred to simply as a verification apparatus) for verifying whether or not a finite state machine indicating the operation of a synchronous sequential machine satisfies the property indicating the functional specification.

The verification apparatus comprises a property input unit 1, that is, a finite state machine, for inputting a finite state machine M and the property relating to the M; a verification result output unit 3 for outputting a verification result; a state transition determination operation unit 4 for obtaining a state set reachable in one state transition process from an element of a state set p; a reachability determination operation unit 6 for obtaining a state set reachable from an element of the state set p through an element of a state set q; a loop determination operation unit 5 for determining, starting with a certain state in the p, whether or not a state transition path which eternally does not exceed the q exists; and a state set division and operation unit call control unit 2 for calling each of the operation units while a state set is divided and obtaining a state transition path corresponding to the property. Furthermore, the property input unit 1, that is, the finite state machine, is provided with a dividing unit 7 for preliminarily dividing input data.

When the finite state machine M and the property relating to the M are input, the property input unit 1 receives the input data, and transfers the input data to the state set division and operation unit call control unit 2 after dividing the input data through the dividing unit 7 if preliminary division is required. However, if the preliminary division is not required, the data is transferred as is directly to the control unit 2.

Then, the state set division and operation unit call control unit 2 divides the state set when it receives the input data, calls each of the operation units 4, 5, and 6, and outputs to the verification result output unit 3 the verification result obtained through a verifying process. At this time, when the state transition determination operation unit 4 (refer to reference document 12) is called, an operation of obtaining a state set reachable from an element of the state set p in one state transition process is performed, and the operation result is returned to the control unit 2.

When the reachability determination operation unit 6 (refer to reference document 12) is called, an operation of obtaining a state set reachable from an element of the state set p through an element of the state set q is performed, and the operation result is returned to the control unit 2. Furthermore, when the loop determination operation unit 5 is called, an operation is performed to determine, starting with a certain state in the p, whether or not a state transition path which eternally does not exceed the q exists. The operation result is returned to the control unit 2.

The above described property input unit 1, the control unit 2, the verification result output unit 3, the state transition determination operation unit 4, the loop determination operation unit 5, and the reachability determination operation unit 6 perform the processes by the execution of programs. Especially, the state transition determination operation unit 4, the loop determination operation unit 5, and the reachability determination operation unit 6 include subroutines. That is, the verifying process is performed by calling each of the subroutines as necessary.

The procedures of FindTrans() and FintTrail() used in the process by the property verification apparatus (refer to Tokuganhei 8-220005) described as the conventional technology are respectively used as a state transition determination procedure by the state transition determination operation unit 4 and a reachability determination procedure by the reachability determination operation unit 6. Instead of the determination as to whether or not a value returned by Findloop() is empty, the procedure in the embodiment 3 or 4 described below is used as the loop determination procedure by the loop determination operation unit 5.

Furthermore, it is not necessary to preliminarily assign all of the state set p1, p2, . . . , pn in the embodiment 3 or 4 described below. The procedure of the embodiment 3 or 4 according to the present invention can be executed in advance when a subset of a return value is obtained during the computation of FindTrans() and FindTrail(). When a state transition path to be verified is detected, the verification procedure can be aborted at an early stage.

Figure 6:
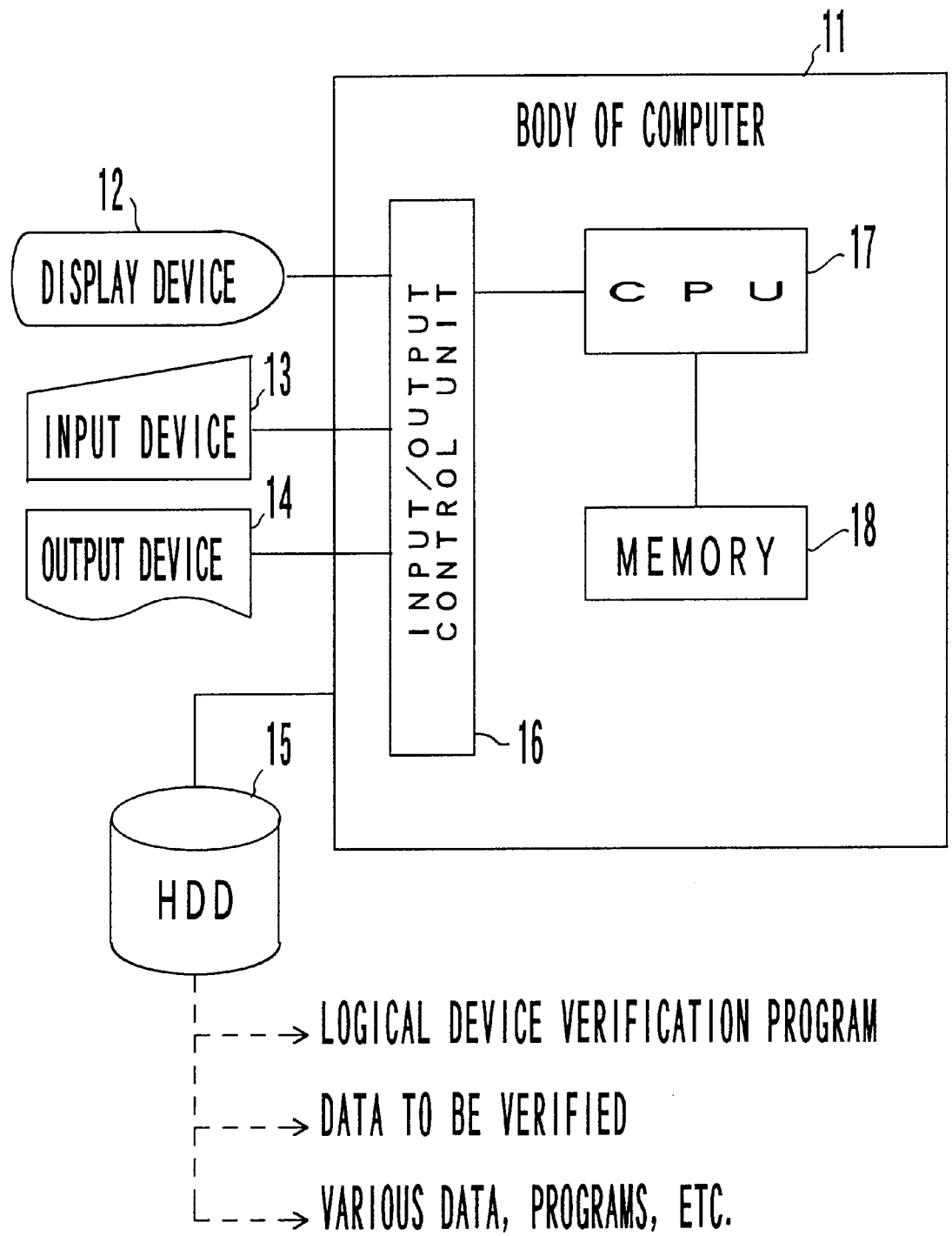
FIG. 6 shows a practical example of the verification apparatus according to an embodiment of the present invention.

FIG. 6 shows a practical example of the verification apparatus. The verification apparatus shown in FIG. 6 is an example of the apparatus embodied as the verification apparatus shown in FIG. 5. In each of the embodiments described below, the verifying process is performed by this verification apparatus.

The verification apparatus shown in FIG. 5 is a device realized by various computers such as an engineering work station, a personal computer, etc. The apparatus includes a body of a computer 11, a display device 12 connected to the body of the computer 11, an input device 13, an output device 14, a hard disk device (HDD) 15, etc. The body of the computer 11 includes an input/output control unit 16, a CPU 17, memory 18, etc.

The storage medium of the hard disk device 15 stores a program for verifying a logical device (program for realizing each unit shown in FIG. 5), other programs, data to be verified, other various data, etc. When a logical device is verified, the data and programs stored on the storage medium of the hard disk device 15 are read and fetched into the body of the computer 11 by the control of the CPU 17, and the CPU 17 executes the programs to perform necessary processes.

The memory 18 is used by the CPU 17 working in a process. The programs and data stored on the storage medium of the hard disk device 15 are stored, for example, as follows.

(1): Data (generated by another device) stored on a flexible disk (floppy disk) is read by a drive device provided in the body of the computer 11, and stored on the storage medium of the hard disk device 15.

(2): Data stored on a storage medium such as a magnet-optical disk or CD-ROM, etc. are read by a drive device provided in the body of the computer 11, and stored on the storage medium of the hard disk device 15.

(3): Data transmitted from another device through a communications line of a LAN, etc. are received by the body of the computer 11, and stored on the storage is medium of the hard disk device 15.

This verification apparatus includes an input unit for inputting a finite state machine M and property relating to the M; an output unit for outputting a verification result; a state transition determination operation unit for obtaining a state set reachable in a single state transition from an element of a state set p; a reachability determination operation unit for obtaining a reachable state set through an element of a set state q from an element of the state set p;

a loop determination operation unit for starting with a certain state in p, and determining whether or not there is a path of a state transition not exceeding q; and a control unit for dividing the state set, calling each of the above described operation units, and obtaining a path of a state transition corresponding to the property.

Thus, each operation unit can be called while a state set is divided to obtain a state transition path corresponding to property. Thus, the state set dividing method can be used and the verifying process can be performed on a complicated logical device whose memory capacity reaches its limit in a common method.

FIG. 7 is a process flowchart according to the embodiment 1 of the present invention. The process in the embodiment 1 is described by referring to FIG. 7. This process is performed by the verification apparatus shown in FIGS. 5 and 6. S51 through S58 indicate the process steps. Image(a) is a function for use in the image computation for the state set a in the finite state machine M, and i is an optional parameter.

In a logical device verifying process for verifying whether or not a finite state machine indicating the operation of a synchronous sequential machine satisfies the property indicating the functional specification, the image computation in the M, and the computation of a set product by q are repeated starting with the state set p when the finite state machine M, the subset q of the state of the M, and the subset p of the q (state set p) are given.

Then, the state set relation of the computation process is checked. As a result, it can be determined, starting with a certain state in the p, whether or not a state transition path which eternally does not exceed the q exists.

When a[i] becomes an empty set by repeating the operation of a[i]←Image(a[i−1])∩q in the above described process, the q is necessarily exceeded if a state starts in the p. If k satisfies a[k]⊆(a [k+1]∪a[k+2]∪ . . . ∪a[i]), it indicates that a[k] always passes through an element of the q and reaches any element of a[k] when a[k] traces back the time from any element.

That is, it is indicated that the loop passing through an element of a[k] exceeds the q, and that a path of a state transition passes through a state in a[k] starting with a certain state in the p, and eternally does not exceed the q. Described below is the verifying process.

When the finite state machine M the subset q of the state of the M, and the subset p of the q are input (S51), the initializing process defines a[0]←p, i←0 (S52). Then; i is incremented (i←i+1) (S53), and the operation of the image computation in the M and the set product by q, that is, a[i]←Image(a[i−1])∩q is performed (S54).

Then, it is determined whether or not a[i] is an empty set (S55). If it is not an empty set, it is then determined whether or not k (0≦k≦i−1) satisfies a[k]⊆(a[k+1]∪a[k+2]∪ . . . ∪a[i]) (S56). As a result, if k does not satisfy a[k] ⊆(a[k+1]∪a[k+2]∪ . . . ∪a[i]), then the processes are repeated from step S53.

That is, the subset p input in step S51 is defined as an initial state set in step S52.

Then, the initial state set is defined as a preprocess state set, and it is verified in steps S54 and S55 whether or not the set product of the post-process state set obtained as a result of the image computation performed on the above described preprocess state set and the above described subset q is an empty set. That is, it is checked whether or not a part of the post-process state sets obtained as a result of the above described image computation are contained in the above described subset q. If the set product in step S55 is an empty set, then none of the state sets obtained as a result of the image computation are contained in the subset q, and no paths can be detected.

Then, if the above described set product is not an empty set in step S55, that is, if a part of the post-process state set, which is a result of an image computation, is contained in the above described subset q, then it is verified in step S56 whether or not a preprocess state set exists in the post-process state sets. If yes, a state transition path which eternally does not exceed a state set q exists.

In step S56, if no pre-process state set exists in the post-process state set, the processes in and after step S54 are repeated with the above described process state set defined as a preprocess state set.

In the second or subsequent step S56 performed in the repeating process, it is also verified whether or not an older preprocess set exists in the post process state set in step S56 in addition to the verification as to whether or not a preprocess state set exists in the post-process state process.

For example, by the time when the process in step S56 is performed three times, in the first step S56, it is verified whether or not the first preprocess state set a[0], which is the initial state set, exists in the first post process state set a[1]. In the second step S56, it is verified whether or not the second preprocess state set a[1] exists in the second post-process state set a[2]. Additionally, it is also verified whether or not the first postprocess state set a[0] exists in the sum set of the first postprocess state set a[1] and the second post-process state set a[2]. In the third step S56, it is verified whether or not the third preprocess state set a[2] exists in the third postprocess state set a[3]. Additionally, it is also verified whether or not the second preprocess state set a[1] exists in the sum set of the second preprocess state set a[2] and the third is postprocess state set a[3]. It is also verified whether or not the first preprocess state set a[0] exists in the sum set of the first postprocess state set a[1], the second postprocess state set a[2], and the third postprocess state set a[3].

If k satisfies a[k]⊆(a[k+1]∪a[k+2]∪ . . . ∪a[i]), then it is indicated that a path of a state transition starts with a certain state in the p, and eternally does not exceed the g. Therefore, the verifying method terminates (S57). However, if it is determined in the process in step S55 that a[i] is an empty set, it is indicated that there is no path of a state transition which starts with a certain state in the p, and eternally does not exceed the q. Therefore, the verifying process terminates (S58).

In the above described process of determining whether or not, starting with a certain state in the p, a state transition path which eternally does not exceed the q exists, a basic algorithm of dividing a state set for computation is provided.

This embodiment 1 repeats image computation in the M and the computation of a set product by q starting with the state set p when the finite state machine M, the subset q of the state of the M, and the subset p of the q are given. Then, the relation of the state set of the computation process is checked. As a result, it can be determined, starting with a certain state in the p, whether or not a state transition path which eternally does not exceed the q exists.

Thus, a basic algorithm of dividing a state set for computation is provided in the process of determining whether or not a state transition path which eternally does not exceed the q starting from a certain state in the p. In most cases of a symbol model check, a state set dividing method can be used. Therefore, a storage capacity can be reduced, and a complicated logical device can be verified.

In the state set dividing method, the verifying process can be performed on a complicated logical device whose memory capacity reaches its limit in a common method. The problem of the storage capacity is serious because it relates to the practicality of a symbol model check, and the present invention contributes to the realization of this practicality.

Furthermore, at the initial stage of the dividing operation, negative or positive examples may be detected. Therefore, for example, at the initial stage of the logical verification in which a number of erroneous designs can be detected, an erroneous design can be detected more quickly according to the present invention than in a method followed without the dividing operation.

FIG. 8 is a process flowchart according to the embodiment 2 of the present invention. The process according to the embodiment 2 is described below by referring to FIG. 8. This process is performed by the verification apparatus shown in FIGS. 5 and 6. S61 through S74 indicate the process steps. Image(a) is a function for use in the image computation for the state set a in the finite state machine M, and i is an optional parameter.

In a logical device verifying process for verifying whether or not a finite state machine indicating the operation of a synchronous sequential machine satisfies the property indicating the functional specification, the state set division, the image computation in the M, and the computation of a set product by q are recursively repeated with the depth processed by priority starting with the state set p when the finite state machine M, the subset q of the state of the M, and the subset p of the q are given. Then, the state set relation of the computation process is checked. As a result, it can be determined, starting with a certain state in the p, whether or not a state transition path which eternally does not exceed the q exists.

In this process, a[i]=t is set, and the t is divided into two portions. One is set as a new a[i], and the other is stored as t in a stack. The new a[i] after the division is processed in the verifying process. The verifying process is repeatedly performed on the new a[i], and it is determined whether or not the above described path exists.

If the above described path is detected in the new a[i], the process terminates. However, if the path cannot be detected, then the other t stored in the stack is retrieved, the similar verifying process is performed on the t as a new a[i], and it is determined whether or not the path exists. The practical process is performed as follows.

When the finite state machine M the subset q of the state of the M, and the subset p of the q are input (S61), the initializing process defines a[0]←p, i←0 (S62). Then, t←a[i] is set (S63), the t is divided into two portions, a[i] is substituted for the t (a[i]≠φ) (S64). That is, a[i] is set as t, the t is divided into two portions, and one of the two portions is set as a[i]. Therefore, the divided two portions are a new a[i] and the remaining t.

Then, it is determined whether or not the t is an empty set (S65). If the t is not an empty set, the current valuable is stored in the stack (S66). If the t is an empty set, no action is taken. Thus, the following process is performed on the newly divided and new a[i]. The other t is stored in the stack if it is not an empty set. When necessary, it is retrieved after the process of the new a[i].

When the process is performed on the new a[i], i is incremented (i←i+1) (S67), and the operation of the image computation in the M and the set product by q, that is, a[i]←Image(a[i−1])∩q is performed (S68).

Then, it is determined whether or not a[i] is an empty set (S69). If it is not an empty set, it is then determined whether or not k ($0 \leq k \leq i-1$) satisfies a[k]⊆(a[k+1]∪a[k+2]∪ ... ∪a[i]) (S70). As a result, if k does not satisfy a[k]⊆(a[k+1]∪a[k+2]∪ ... ∪a[i]), then the processes are repeated from step S63.

That is, the subset p input in step S61 is defined as an initial state set in step S62.

Then, a part of the initial state set is defined as a preprocess state set in steps S63 and S64, and it is verified in steps S68 and S69 whether or not the set product of the post-process state set obtained as a result of the image computation performed on the above described preprocess state set and the above described subset q is an empty set. That is, it is checked whether or not a part of the post-process state sets obtained as a result of the above described image computation are contained in the above described subset q. If the set product in step S69 is an empty set, then none of the state sets obtained as a result of the image computation are contained in the subset q, and no paths can be detected.

Then, if the above described set product is not an empty set in step S69, that is, if a part of the post-process state set, which is a result of an image computation, is contained in the above described subset q, then it is verified in step S70 whether or not a preprocess state set exists in the post-process state sets. If yes, a state transition path which eternally does not exceed a state set q exists.

In step S70, if no pre-process state set exists in the post-process state set, the processes in and after step S68 are repeated with the above described process state set defined as a preprocess state set through incrementation in step S67.

In the second or subsequent step S70 performed in the repeating process, it is also verified whether or not an older preprocess set exists in the post process state set in step S70 in addition to the verification as to whether or not a preprocess state set exists in the post-process state process.

For example, by the time when the process in step S70 is performed three times, in the first step S70, it is verified whether or not the first preprocess state set a[0], which is a part of the initial state set, exists in the first post process state set a[1]. In the second step S70, it is verified whether or not the second preprocess state set a[1] exists in the second postprocess state set a[2]. Additionally, it is also verified whether or not the first postprocess state set a[0] exists in the sum set of the first postprocess state set a[1] and the second postprocess state set a[2]. In the third step S70, it is verified whether or not the third preprocess state set a[2] exists in the third postprocess state set a[3]. Additionally, it is also verified whether or not the second preprocess state set a[1] exists in the sum set of the second preprocess state set a[2] and the third postprocess state set a[3]. It is also verified whether or not the first preprocess state set a[0] exists in the sum set of the first postprocess state set a[1], the second postprocess state set a[2], and the third postprocess state set a[3].

Then, if the set product is an empty set in step S69, that is, a part of the postprocess state set obtained as a result of the image computation is not contained in the above described subset q, then the remaining portion which is not a preprocess state set in steps S63 and S64 is defined in step 73 as a preprocess state set in step 65.

If k satisfies a[k]⊆(a[k+1]∪a[k+2]∪ ... ∪a[i]), then it is indicated that a path of a state transition starts with a certain state in the p, and eternally does not exceed the q. Therefore, the verifying method terminates (S71). However, if it is determined in the process in step S69 that a[i] is an empty set, it is indicated that there is no path of a state transition which starts with a certain state in the p, and eternally does not exceed the q. Therefore, the verifying process terminates for the new a[i], and it is determined whether or not the stack is empty (S72).

As a result, if the stack is not empty, a variable is restored in the stack (S72), and the processes are repeated from the process in S67. However, if the stack is empty in the process in step S72, then it is determined that the path cannot be detected, and the verifying process terminates (S74).

When the finite state machine M, the subset q of the state of the M, and the subset p of the q are input, the embodiment 2 according to the present invention recursively repeats with the depth processed by priority the division of a state set, the image computation in the M, and the computation of a set product by q. Then, the computation process is checked. As a result, it can be determined, starting with a certain state in the p, whether or not state transition paths which eternally do not exceed the q exist.

Thus, an algorithm of dividing a state set for each repeated computation is provided in the process of determining whether or not a state transition path which eternally does not exceed the q starting from a certain state in the p. Therefore, a storage capacity can be reduced by the division of the state set, and the verifying process can be performed on a complicated logical device whose memory capacity reaches its limit in a common method.

FIG. 9 is a process flowchart according to the embodiment 3 of the present invention. The process according to the embodiment 3 is described below by referring to FIG. 9. This process is performed in the verification apparatus shown in FIGS. 5 and 6. S81 through S91 indicate the process steps. Image(a) is a function for use in the image computation for the state set a in the finite state machine M, and i is an optional parameter.

In a logical device verifying process for verifying whether or not a finite state machine indicating the operation of a synchronous sequential machine satisfies the property indicating the functional specification, the image computation in the M, and the computation of a set product by q are repeated starting with the state set p when the finite state machine M, the subset q of the state of the M, and the subset p[1], p[2], ..., p[n](hereinafter, the subset of the q is referred to as p1, p2, ..., pn) of the q are given. Then, the state set relation of the computation process-is checked. As a result, it can be determined, starting with a certain state in the p1∪p2∪p3 ... ∪pn, whether or not a state transition path which eternally does not exceed the q exists. The practical process is performed as follows.

When the finite state machine M the subset q of the state of the M, and the subset p of the q are input (S81), the initializing process substitutes 1for an optional parameter (j←1) (S82), and defines a [0]←p[j], i←0 (S83). Then, i is incremented (i←i+1) (S84), and the operation of the image computation in the M and the set product by q, that is, a[i]←Image (a[i−1])∩q is performed (S85).

Then, it is determined whether or not a[i] is an empty set (S86). If it is not an empty set, it is then determined whether or not k (0≦k≦i−1) satisfies a[k]⊆(a[k+1]∪a[k+2]∪ ... ∪a[i]) (S87). As a result, if k does not satisfy a[k] ⊆(a[k+1]∪a[k+2]∪ ... ∪a[i]), then the processes are repeated from step S84.

That is, the subset p[J] input in step S81 is sequentially defined (in steps 89 and 90) as an initial state set in step S83.

Then, the initial state set is defined as a preprocess state set, and it is verified in steps S85 and S86 whether or not the set product of the post-process state set obtained as a result of the image computation performed on the above described preprocess state set and the above described subset q is an empty set. That is, it is checked whether or not a part of the post-process state sets obtained as a result of the above described image computation are contained in the above described subset q. If the set product in step S86 is an empty set, then none of the state sets obtained as a result of the image computation are contained in the subset q, and no paths can be detected.

Then, if the above described set product is not an empty set in step S86, that is, if a part of the post-process state set, which is a result of an image computation, is contained in the above described subset q, then it is verified in step S87 whether or not a preprocess state set exists in the post-process state sets. If yes, a state transition path which eternally does not exceed a state set g exists.

In step S87, if no pre-process state set exists in the post-process state set, the processes in and after step S54 are repeated with the above described process state set defined as a preprocess state set.

In the second or subsequent step S87 performed in the repeating process, it is also verified whether or not an older preprocess set exists in the post process state set in step S87 in addition to the verification as to whether or not a preprocess state set exists in the post-process state process.

For example, by the time when the process in step S56 is performed three times, in the first step S87, it is verified whether or not the first preprocess state set a[0], which is the initial state set, exists in the first post process state set a[1]. In the second step S87, it is verified whether or not the second preprocess state set a[1] exists in the second post-process state set a[2]. Additionally, it is also verified whether or not the first postprocess state set a[0] exists in the sum set of the first postprocess state set a[1] and the second post-process state set a[2]. In the third step S87, it is verified whether or not the third preprocess state set a[2] exists in the third postprocess state set a[3]. Additionally, it is also verified whether or not the second preprocess state set a[1] exists in the sum set of the second preprocess state set a[2] and the third postprocess state set a[3]. It is also verified whether or not the first preprocess state set a[0] exists in the sum set of the first postprocess state set a[1], the second postprocess state set a[2], and the third postprocess state set a[3].

If k satisfies a[k]⊆(a[k+1]∪a[k+2]∪ ... ∪a[i]), then it is indicated that a path of a state transition starts with a certain state in the p, and eternally does not exceed the q. Therefore, the verifying method terminates (S88). However, if it is determined in the process in step S86 that a[i] is an empty set, it is indicated that there is no-path of a state transition which starts with a certain state in the p, and eternally does not exceed the q. Therefore, j is incremented (j←j+1) (S89), and it is determined whether or not the conditions of j≦n are satisfied (S90).

As a result, if the condition of j≦n is satisfied, the processes are repeated from the process in S83. If the condition of 1≦n is not satisfied, that is, j>n, then it is determined that the path does not exist, and the verifying process terminates (S91).

The embodiment 3 according to the present invention repeats the image computation in the M, the computation of a set product by q starting with the state set p with each of subsets p1, p2, ..., pn set as q when the finite state machine M, the subset q of the state of the M, and the subset p1, p2, ..., pn of the q are given. Then, the relation of the state set of the computation process is checked. As a result, it can be determined, starting with a certain state in the p1∪p2∪p3 . . . ∪pn, whether or not a state transition path which eternally does not exceed the q exists.

Thus, an algorithm of separately, not collectively, computing the p when it is divided into p1, p2, . . . , pn is assigned in the process of determining whether or not a state transition path which eternally does not exceed the q starting from a certain state in the p, and the verifying process can be performed on a complicated logical device whose memory capacity reaches its limit in a common method.

FIG. 10 is a process flowchart according to the embodiment 4 of the present invention. The process according to the embodiment 4 is described below by referring to FIG. 10. This process is performed by the verification apparatus shown in FIGS. 5 and 6. S101 through S117 indicate the process steps.

In a logical device verifying process for verifying whether or not a finite state machine indicating the operation of a synchronous sequential machine satisfies the property indicating the functional specification, the state set division, the image computation in the M, and the computation of a set product by q are recursively repeated with the depth processed by priority starting with the state set p when the finite state machine M, the subset q of the state of the M, and the subset p[1], p[2], . . . , p[n] (hereinafter, the subset of the q is referred to as p1, p2, . . . , pn) of the q are given. Then, the computation process is checked. As a result, it can be determined, starting with a certain state in the p1∪p2∪p3 . . . ∪pn, whether or not a state transition path which eternally does not exceed the q exists. The practical process is performed as follows.

When the finite state machine M the subset q of the state of the M, and the subset p1, p2, . . . , pn of the q are input (S101), the initializing process substitutes 1 for an optional parameter (J←1) (S102), and defines a[0]←p[j], i←0 (S103). Then, t←a[i] is set (S104), the t is divided into two portions, a[i] is substituted for the t (a[i]≠φ) (S105). That is, a[i] is set as t, the t is divided into two portions, and one of the two portions is set as a[i]. Therefore, the divided two portions are a new a[i] and the remaining t.

Then, it is determined whether or not the t is an empty set (S106). If the t is not an empty set, the current valuable is stored in the stack (S107). If the t is an empty set, no action is taken. Thus, the following process is performed on the newly divided and new a[i]. The other t is stored in the stack if it is not an empty set. When necessary, it is retrieved after the process of the new a[i].

When the process is performed on the new a[i], i is incremented (i←i+1) (S108), and the operation of the image computation in the M and the set product by q, that is, a[i]←Image(a[i-1])∩q is performed (S109). Then, it is determined whether or not a[i] is an empty set (S110). If it is not an empty set, it is then determined whether or not k (0≦k≦i-1) satisfies a[k]⊆(a[k+1]∪a[k+2]∪ . . . ∪a[i]) (S111). As a result, if k does not satisfy a[k] ⊆(a[k+1]∪a[k+2]∪ . . . ∪a[i]), then the processes are repeated from step S104.

That is, the subset p[j] input in step 101 is sequentially defined (in steps 115 and 116) as an initial state set in step S103.

Then, a part of initial state set is defined as a preprocess state set, and it is verified in steps S104 and S105 whether or not the set product of the post-process state set obtained as a result of the image computation performed on the above described preprocess state set and the above described subset q is an empty set. That is, it is checked whether or not a part of the post-process state sets obtained as a result of the above described image computation are contained in the above described subset q. If the set product in step S110 is an empty set, then none of the state sets obtained as a result of the image computation are contained in the subset q, and no paths can be detected.

Then, if the above described set product is not an empty set in step S110, that is, if a part of the post-process state set, which is a result of an image computation, is contained in the above described subset q, then it is verified in step S111 whether or not a preprocess state set exists in the post-process state sets. If yes, a state transition path which eternally does not exceed a state set q exists.

In step S111, if no pre-process state set exists in the post-process state set, the processes in and after step S109 are repeated with the above described process state set defined as a preprocess state set.

In the second or subsequent step S56 performed in the repeating process, it is also verified whether or not an older preprocess set exists in the post process state set in step S111 in addition to the verification as to whether or not a preprocess state set exists in the post-process state process.

For example, by the time when the process in step S111 is performed three times, in the first step S111, it is verified whether or not the first preprocess state set a[0], which is a part of the initial state set, exists in the first post process state set a[1]. In the second step S111, it is verified whether or not the second preprocess state set a[1] exists in the second postprocess state set a[2]. Additionally, it is also verified whether or not the first postprocess state set a[0] exists in the sum set of the first postprocess state set a[1] and the second postprocess state set a[2]. In the third step S111, it is verified whether or not the third preprocess state set a[2] exists in the third postprocess state set a[3]. Additionally, it is also verified whether or not the second preprocess state set a[1] exists in the sum set of the second preprocess state set a[2] and the third postprocess state set a[3]. It is also verified whether or not the first preprocess state set a[0] exists in the sum set of the first postprocess state set a[1], the second postprocess state set a[2], and the third postprocess state set a[3].

Then, if the set product is an empty set in step S110, that is, a part of the postprocess state set obtained as a result of the image computation is not contained in the above described subset q, then the remaining portion which is not a preprocess state set in steps S104 and S105 is defined in step 114 as a preprocess state set in step 105.

If k satisfies a[k]⊆(a[k+1]) ∪a[k+2]∪ . . . ∪a[i]), then it is indicated that a path of a state transition starts with a certain state in the p, and eternally does not exceed the q. Therefore, the verifying method terminates (S112). However, if it is determined in the process in step S111 that a[i] is an empty set, it is indicated that there is no path of a state transition which starts with a certain state in the p, and eternally does not exceed the q. Therefore, the verifying process terminates for the new a[i], and it is determined whether or not the stack is empty (S113).

As a result, if the stack is not empty, a variable is restored in the stack (S114), and the processes are repeated from the process in S108. However, if the stack is empty in the process in step S113, then j is incremented (j←j+1) (S115), and it is determined whether or not the conditions of j≦n are satisfied (S116). As a result, if the condition of j≦n is satisfied, the processes are repeated from the process in S103. If the condition of 1≦n is not satisfied, that is, j>n, then it is determined that the path does not exist, and the verifying process terminates (S117).

The embodiment 4 according to the present invention recursively repeats the state set division, the image computation in the M, the computation of a set product by q with the depth processed by priority starting with the state set p with each of subsets p1, p2, . . . , pn set as p when the finite state machine M, the state set q of the M, and the subset p1, p2, . . . , pn of the q are given. Then, the relation of the state set of the computation process is checked. As a result, it can be determined, starting with a certain state in the p1∪p2∪p3 . . . ∪pn, whether or not a state transition path which eternally does not exceed the q exists.

Thus, an algorithm of separately, not collectively, computing the p when it is divided into p1, p2, . . . , pn is assigned in the process of determining whether or not a state transition path which eternally does not exceed the q starting from a certain state in the p, and the verifying process can be performed on a complicated logical device whose memory capacity reaches its limit in a common method.

Other Embodiments

The embodiments of the present invention are described above, but the present invention can also be applied to the following applications.

If it is determined that the q is necessarily exceeded when a state set is divided in the above described logical device verifying process starting with a state in a certain set r, then it is indicated that there is no loop of a state transition in the r. Therefore, the q can be replaced with q∩r̄ in the subsequent computation. As explained above, according to the present invention, the image computation in the M and the computation of a set product by q are repeated starting with the state set p when the finite state machine M, the subset q of the state of the M, and the subset p of the q are given. Then, the relation of the state set of the computation process is checked. As a result, it can be determined, starting with a certain state in the p, whether or not a state transition path which eternally does not exceed the q exists. Thus, a state set division method can be used in most cases of the symbol model check.

In the state set dividing method, the verifying process can be performed on a complicated logical device whose memory capacity reaches its limit in a common method. The problem of the storage capacity is serious because it relates to the practicality of a symbol model check, and the present invention contributes to the realization of this practicality.

Furthermore, at the initial stage of the dividing operation, negative or positive examples may be detected. Therefore, for example, at the initial stage of the logical verification in which a number of erroneous designs can be detected, an erroneous design can be detected more quickly according to the present invention than in a method followed without the dividing operation.

What is claimed is:

1. A computerized logical device verification method, comprising:

repeating image computation in a finite state machine data M indicating an operation of a synchronous sequential machine and computation of a set product by a subset data q of a state of the finite state machine data M starting with a subset data p of the subset data q when the finite state machine data M, the subset data q, and the subset data p are given;

checking a relation between an intermediate state set in said repeating and the subset data q;

determining whether or not a state transition path which eternally does not exceed the subset data q exists, starting with a certain state in the subset data p, based on said checking; and verifying whether or not the finite state machine data M satisfies a property indicating a functional specification, based on said determining.

2. A computerized logical device verification method, comprising:

recursively repeating state set division, image computation in a finite state machine data M indicating an operation of a synchronous sequential machine, and computation of a set product by a subset data q of a state of the finite state machine data M with depth processed by priority starting with subset data p of the subset data q when the finite state machine data M, the subset data q, and the subset data p are given;

checking a relation between an intermediate state set in said repeating and the subset data q;

determining whether or not a state transition path which eternally does not exceed the subset data q exists, starting with a certain state in the subset data p, based on said checking; and verifying whether or not the finite state machine data M satisfies a property indicating a functional specification, based on said determining.

3. A computerized logical device verification method, comprising:

repeating image computation in a finite state machine data M indicating an operation of a synchronous sequential machine and computation of a set product by a subset data q of a state of the finite state machine data M starting with a subset data p of the subset data q when the finite state machine data M, the subset data q, and subset data p1, p2, . . . , pn of the subset data q are given with each of the subset data p1, p2, . . . , pn set as the subset data p;

checking a relation between an intermediate state set in said repeating and the subset data q;

determining whether or not a state transition path which eternally does not exceed the subset data q exists, starting with a certain state in the subset data p1∪p2∪p3 . . . ∪pn, based on said checking; and verifying whether or not the finite state machine data M satisfies a property indicating a functional specification, based on said determining.

4. A computerized logical device verification method, comprising:

recursively repeating state set division, image computation in a finite state machine data M indicating an operation of a synchronous sequential machine, and computation of a set product by a subset data q of a state of the finite state machine data M with depth process by priority starting with subset data p of the subset data q when the finite state machine data M, the subset data q, and subset data p1, p2, . . . , pn of the subset data q are given with each of the subset data p1, p2, . . . , pn set as the subset data p;

checking a relation between an intermediate state set in said repeating and the subset data q;

determining whether or not a state transition path which eternally does not exceed the subset data q exists, starting with a certain state in the subset data p1∪p2∪p3 . . . ∪pn, based on said checking; and verifying whether or not the finite state machine data M satisfies a property indicating a functional specification, based on said determining.

5. A computerized logical device verification apparatus, comprising:

an input unit inputting a finite state machine data M indicating an operation of a synchronous sequential machine and properties relating to the finite state machine data M;

an output unit outputting a verification result;

a state transition determining operation unit obtaining a state set data reachable in a single state transition from an element of a subset data p, wherein the subset data p is a subset of a subset data q and the subset data q is a subset of the finite state machine data M;

a reachability determination operation unit obtaining a reachable state set data through an element of the subset data q from an element of the subset data p;

a loop determination operation unit determining whether or not there is a path of a state transition not exceeding the subset data q, starting with a certain state in the subset data p;

a control unit dividing the state set, calling each of said state transition determination operation unit, said reachability determination operation unit, and said loop determination operation unit, obtaining a path of a state transition corresponding to the property; and verifying whether or not a finite state machine satisfies a property indicating a functional specification.

6. A computer-readable storage medium used to direct a computer to perform:

repeating image computation in a finite state machine data M indicating an operation of a synchronous sequential machine and computation of a set product by a subset data q of a state of the finite state machine data M starting with a subset data p of the subset data q when the finite state machine data M, the subset data q, and the subset data p are given;

checking a relation between an intermediate state set in said repeating and the subset data q;

determining whether or not a state transition path which eternally does not exceed the subset data q exists, starting with a certain state in the subset data p, based on said checking; and verifying whether or not the finite state machine data M satisfies a property indicating a functional specification, based on said determining.

7. A computer-readable storage medium used to direct a computer to perform:

recursively repeating state set division, image computation in a finite state machine data M indicating an operation of a synchronous sequential machine, and computation of a set product by a subset data q of a state of the finite state machine data M with depth processed by priority starting with subset data p of the subset data q when the finite state machine data M, the subset data q, and the subset data p are given;

checking a relation between an intermediate state set in said repeating and the subset data q;

determining whether or not a state transition path which eternally does not exceed the subset data q exists, starting with a certain state in the subset data p, based on said checking; and verifying whether or not the finite state machine data M satisfies a property indicating a functional specification, based on said determining.

8. A computer-readable storage medium used to direct a computer to perform:

repeating image computation in a finite state machine data M indicating an operation of a synchronous sequential machine and computation of a set product by subset data q of a state of the finite state machine data M starting with a subset data p of the subset data q when the finite state machine data M, the subset data q, and subset data p1, p2, . . . , pn of the subset data q are given with each of the subset data p1, p2, . . . , pn set as the subset data p;

checking a relation between an intermediate state set in said repeating and the subset data q;

determining whether or not a state transition path which eternally does not exceed the subset data q exists, starting with a certain state in the subset data p1∪p2∪p3 . . . ∪pn, based on said checking; and verifying whether or not the finite state machine data M satisfies a property indicating a functional specification, based on said determining.

9. A computer-readable storage medium used to direct a computer to perform:

recursively repeating state set division, image computation in a finite state machine data M indicating an operation of a synchronous sequential machine, and computation of a set product by a subset data q of a state of the finite state machine data M with depth processed by priority starting with subset data p of the subset data q when the finite state machine data M, the subset data q, and subset data p1, p2, . . . , pn of the subset data q are given with each of the subset data p1, p2, . . . , pn set as the subset data p;

checking a relation between an intermediate state set in said repeating and the subset data q;

determining whether or not a state transition path which eternally does not exceed the subset data q exists, starting with a certain state in the subset data p1∪p2∪p3 . . . ∪pn, based on said checking; and verifying whether or not the finite state machine data M satisfies a property indicating a functional specification, based on said determining.

10. A computerized logical device verification method, comprising:

inputting data consisting of a finite state machine data M indicating an operation of a synchronous sequential machine, a subset data q of a state of the finite state machine data M, and a subset data p of the subset data q;

computing image computation of the subset data p in the finite state machine data M;

computing set product computation with a result of said computing image computation and the subset data q;

checking a relation between an intermediate state set of a result by repeating said computing image computation and said computing set product computation and the subset data q;

determining whether or not a state transition path which eternally does not exceed the subset data q exists, starting with a certain state in the subset data p, based on said checking; and verifying whether or not the finite state machine data M satisfies a property indicating a functional specification, based on said determining.

11. The computerized logical device verification method according to claim 10, further comprising:

dividing the inputted data by said inputting into two groups; and recursively repeating, as a group, said dividing, said computing image computation, said computing set product computation, said checking, said determining, and said verifying.

12. The computerized logical device verification method according to claim 10, further comprising:

inputting a subset data p1, p2, ..., pn set as the subset data p, in the inputted data;

defining the subset data p as a starting state set; and updating said defining.

13. The computerized logical device verification method according to claim 12, further comprising:

dividing the inputted data of the subset data p1, p2, ..., pn by said inputting into two groups;

recursively repeating, as a group, said dividing, said computing image computation, said computing set product computation, said checking, said determining; and said verifying.

14. A computer-readable storage medium used to direct a computer to perform:

inputting data consisting of a finite state machine data M indicating an operation of a synchronous sequential machine, a subset data q of a state of the finite state machine data M, and a subset data p of the subset data q;

computing image computation of the subset data p in the finite state machine data M;

computing set product computation with a result of said computing image computation and the subset data q;

checking a relation between an intermediate state set of a result by repeating said computing image computation and said computing set product computation and the subset data q;

determining whether or not a state transition path which eternally does not exceed the subset data q exists, starting with a certain state in the subset data p based on said checking; and verifying whether or not the finite state machine data M satisfies a property indicating a functional specification, based on said determining.

15. The computer-readable storage medium according to claim 14, further used to direct a computer to perform:

dividing the inputted data by said inputting into two groups; and recursively repeating, as a group, said dividing, said computing image computation, said computing set product computation, said checking, said determining, and said verifying.

16. The computer-readable storage medium according to claim 14, further used to direct a computer to perform:

inputting a subset data p1, p2, ..., pn set as the subset data p, in the inputted data;

defining the subset data p as a starting state set; and updating said defining.

17. The computer-readable storage medium according to claim 16, further used to direct a computer to perform:

dividing the inputted data of the subset data p1, p2, ..., pn by said inputting into two groups; and recursively repeating, as a group, said dividing, said computing image computation, said computing set product computation, said checking, said determining, and said verifying.

18. A computerized logical device verification apparatus, comprising:

an input unit inputting data consisting of a finite state machine data M indicating an operation of a synchronous sequential machine, a subset data q of a state of the finite state machine data M, and a subset data p of the subset data q;

a state transition determination operation unit obtaining a state set data reachable in a single state transition from an element of the subset data p;

a loop determination operation unit determining whether or not there is a path of a state transition not exceeding the subset data q, starting with a certain state in the subset data p;

a reachability determination operation unit obtaining a reachable state set data through an element of the subset data q from an element of the subset data p;

a control unit controlling each of said state transition determination operation unit, said reachability determination operation unit, and said loop determination operation unit, obtaining a path of a state transition corresponding to the property, and verifying whether or not a finite state machine satisfies a property indicating a functional specification; and an output unit outputting a verification result.

19. A computerized logical device verification apparatus according to claim 18, further comprising:

a dividing unit dividing the inputted by the input unit into two groups; and a control unit controlling said dividing device.

20. A computerized logical device verification apparatus according to claim 18, further comprising:

an input unit inputting state set data of subset data p1, p2, ..., pn set as the subset data p.

21. A computerized logical device verification apparatus according to claim 20, further comprising:

a dividing unit dividing the inputted data of the subset data p1, p2, ..., pn by the input unit into two groups; and a control unit controlling said dividing unit.

* * * * *